United States Patent
Lee et al.

(10) Patent No.: US 7,208,041 B2
(45) Date of Patent: Apr. 24, 2007

(54) METHOD FOR SINGLE CRYSTAL GROWTH OF PEROVSKITE OXIDES

(75) Inventors: Ho-Yong Lee, Seoul (KR); Jong-Bong Lee, Chunan-Si (KR); Tae-Moo Hur, Asan-Si (KR)

(73) Assignee: Ceracomp Co., Ltd., Choongchung-Nam-Do (KR)

( * ) Notice: Subject to any disclaimer, the term of this patent is extended or adjusted under 35 U.S.C. 154(b) by 309 days.

(21) Appl. No.: 10/845,095

(22) Filed: May 14, 2004

(65) Prior Publication Data

US 2004/0206296 A1 Oct. 21, 2004

Related U.S. Application Data

(63) Continuation-in-part of application No. 09/857,774, filed as application No. PCT/KR01/00267 on Feb. 22, 2001, now abandoned.

(30) Foreign Application Priority Data

Feb. 23, 2000 (KR) ................................. 2000-8916
Feb. 21, 2001 (KR) ................................. 2001-8685

(51) Int. Cl.
*C30B 1/10* (2006.01)
(52) U.S. Cl. ........................ 117/2; 117/3; 117/4; 117/7; 117/8; 117/9
(58) Field of Classification Search ................... 117/2, 117/3, 4, 7, 8, 9
See application file for complete search history.

(56) References Cited

U.S. PATENT DOCUMENTS 4,339,301 A 7/1982 Matsuzawa et al.

(Continued)

FOREIGN PATENT DOCUMENTS

| JP | 44-8557 | 4/1969 |
|---|---|---|
| JP | 44-20308 | 9/1969 |
| JP | 61-91091 | 5/1986 |
| JP | 61-146779 | 7/1986 |
| JP | 61-146780 | 7/1986 |
| JP | 63-35496 | 2/1988 |
| JP | 04-042855 A2 | 2/1992 |
| JP | 04-300296 A | 10/1992 |
| JP | 06-056595 | 3/1994 |
| JP | 09-263496 | 10/1997 |
| KR | 00143799 | 11/1998 |

OTHER PUBLICATIONS

Yamamoto, Takahisa et al., "Fabrication of Barium Titanate Single Crystals by Solid-State Grain Growth", Journal of the American Ceramic Society, vol. 77, No. 4, pp. 1107-1109, Apr. 1994.

(Continued)

*Primary Examiner*—Robert Kunemund
(74) *Attorney, Agent, or Firm*—Browdy and Neimark, PLLC

(57) ABSTRACT

An effective, simple and low-cost a method for growing single crystals of perovskite oxideshaving primary and secondary abnormal grain growths according to temperature condition higher than a determined temperature or an atmosphere of heat treatment, involves a perovskite seed single crystal being adjoined to a polycrystal of perovskite oxides and heating the adjoined combination whereby the seed single crystal grows into the polycrystal at the interface therebetween repressing secondary abnormal grain growths inside the polycrystal. 1) The composition ratio of the polycrystal is controlled and/or the specific component(s) of the polycrystal is(are) added in an excess amount compared to the amount of the component(s) of the original composition of the polycrystal, 2) the heating is performed in the temperature range which is over primary abnormal grain growths completion temperature and below secondary abnormal grain growths activation temperature, whereby the seed single crystal grows continuously.

15 Claims, 23 Drawing Sheets

U.S. PATENT DOCUMENTS

| | | |
|---|---|---|
| 4,402,787 A | 9/1983 | Matsuzawa et al. |
| 4,519,870 A | 5/1985 | Matsuzawa et al. |
| 4,900,393 A | 2/1990 | Kugimiya et al. |
| 5,114,528 A | 5/1992 | Kou |
| 5,439,876 A | 8/1995 | Graf et al. |
| 5,541,764 A | 7/1996 | Zhu et al. |
| 5,611,854 A | 3/1997 | Veal et al. |
| 5,804,907 A | 9/1998 | Park et al. |
| 5,998,910 A | 12/1999 | Park et al. |
| 6,048,394 A * | 4/2000 | Harmer et al. .................. 117/8 |
| 6,103,072 A | 8/2000 | Nishiwaki et al. |
| 6,355,185 B1 | 3/2002 | Kubota |
| 6,482,259 B1 | 11/2002 | Lee et al. |
| 2002/0179000 A1 | 12/2002 | Lee et al. |

OTHER PUBLICATIONS

Hennings, Phillips GMBH Forschungslab, Ber. Dtsch. Keram. Gesselsch., 55(7), pp. 359-360, 1978.

Kingery, et al, Introduction to Ceramics, $2^{nd}$ Ed. John Wiley & Sons, New York, pp. 452-455, 461-468, 1976.

Pfister, Siemens Zeitschrift, May 1955, Heft 6/6, pp. 199-205.

Schm,Elz, et al, Zent. Forsch. Entwickl., Siemens A.-G., Munich, Ceramic Forum International, 59(8-9), pp. 436-440, 1982.

* cited by examiner

METHOD FOR SINGLE CRYSTAL GROWTH OF PEROVSKITE OXIDES

RELATED APPLICATIONS

This application is a continuation-in-part of parent application Ser. No. 09/857,774, nationalized Jun. 11, 2001 now abandoned, which application is the national stage of international application PCT/KR01/00267, filed Feb. 22, 2001.

BACKGROUND OF THE INVENTION

1. Field of the Invention

The present invention relates to a method for growing single crystals of perovskite oxides, more particularly, to a method for growing single crystals of perovskite oxides characterized in that a perovskite seed single crystal such as barium titanate ($BaTiO_3$) etc. is adjoined to a polycrystal of perovskite oxides such as barium titanate ($BaTiO_3$) etc., which is controlled in its composition ratio and/or in the added amount of its specific components, and then the adjoined combination is heated, herein, said heat treatment and said control of the composition ratio and the added amount are performed so as to make the seed single crystal grow into the polycrystal at the interface between the seed single crystal and the polycrystal(adjoined part) and to repress secondary abnormal grain gowths inside the polycrystal.

In addition, the invention relates to a method for producing single crystals of perovskite oxides at low costs on a large scale by using the single crystal, which has the composition of the polycrystal, produced according to the above method as a seed single crystal.

In the present invention, "primary abnormal grain growth" means the abnormal grain growth occurring in advance during a heat treatment under the Eutectic temperature, which is known as a conventional and usual "abnormal grain growth".

In the present invention, "secondary abnormal grain growth", which is different from the primary abnormal grain growth, means the abnormal grain growth that occurs again during a long-term heat treatment over a specific temperature after the completion of the primary abnormal grain growth, wherein a bimodal distribution of grain sizes is disappeared and a distribution of grain sizes comes to be uniform.

In the present invention, "combination" means a polycrystal and a seed single crystal adjoined to the polycrystal.

2. Description of the Related Art

The "perovskite oxides" as used herein have a chemical formula of "$ABO_3$", e.g., $BaTiO_3$. In Pb-type perovskite oxides, Pb substitutes for entire or a portion of "A" of the above formula, e.g., "$(Pb_xA_{1-x})BO_3$" (0 x 1) of a simple form or "$(Pb_xA_{1-x})(B_yC_{1-y})O_3$"(0 x 1; 0 y 1), in which the number of the atoms substituting for "A" or "B" increases. Pb-type perovskite oxides include $PbTiO_3$(PT), (Pb, Ba)$TiO_3$, $Pb(Zr_xTi_{1-x})O_3$(PZT), $Pb(Mg_{1/3}Nb_{2/3})O_3$ (PMN), (1−x) PMN-xPT, (1−x−y)PMN-xPT-yPZ, $Pb(Zn_{1/3}Nb_{2/3})O_3$ (PZN) or (1−x) PZN-xPT, (1−x−y)PZN-xPT-yPZ, etc.

The single crystals of perovskite oxides are widely applied in various fields, including optical, piezoelectric, electric or mechanical field, etc., and the application fields will be extended with industry development.

The single crystals of undoped barium titanate and barium titanate solid solution are widely used as a material for piezoelectric devices and optical devices such as optical valve, optical interrupter, and phase-matching mirror, etc. and considered as a promising substrate material for various thin film elements.

In Pb-type perovskite oxides, particularly, the single crystals of $Pb(Zr_xTi_{1-x})O_3$(PZT), (1−x)$Pb(Mg_{1/3}Nb_{2/3})O_3$-xPbTiO_3(PMN-PT) or (1−x)$Pb(Zn_{1/3}Nb_{2/3})O_3$-xPbTiO_3(PZN-PT), etc. and the solid solution thereof are considered as promising materials for electronic devices, because of their high dielectric and excellent piezoelectric properties such as remarkable electro-mechanical coupling factors.

The conventional methods for growing a single crystal of barium titanate ($BaTiO_3$), barium titanate solid solution, Pb-type perovskite and Pb-type perovskite solid solution require expensive facilities, however, involves many problems in producing a large amount of big single crystals because of extremely complicated process for growing the single crystals and have difficulty in the application because of the high expense.

In particular, Pb-type perovskite oxides have serious problems because lead oxide(PbO) having a strong volatility volatilizes when single crystals grow. Further, the conventional methods for growing a single crystal of Pb-type perovskite oxides and the solid solution thereof necessarily require a melting process, and thus make the entire composition change and the phase of the perovskite unstable owing to the volatilization of PbO. Therefore, it is difficult to produce a single crystal having a specific size intented as its final size and property. In addition, it is difficult to produce in large quantities because of the difficulty in the production processes and the requirement of expensive facilities.

Since the emergence of Flux method for single crystal growth of (1−x) Pb $(Mg_{1/3}Nb_{2/3})O_3$-xPbTiO_3 (PMN-PT), the subsequent methods for single crystal growth have been developed such as the Bridgman Method, etc. However, these general methods such as Flux Method or Bridgman Method using a melting process, etc. present some problems in the production of PMN-PT single crystal in that it is difficult to maintain the uniform composition of the growing single crystal owing to the volatilization of PbO during the melting process. Therefore, the processes require complicated facilities and skilled functions and are difficult to produce single crystals in large quantities at low costs.

The production of single crystals of $Pb(Zr_xT_{1-x})O_3$(PZT) having an actually applicable size by general liquid-state single crystal growth methods is considered to be impossible, because of the difficulty in repression of the strong volatilization of PbO and the separation to liquid phase and $ZrO_2$ during melting, i.e., Incongruent Melting. In case of the mass production of single crystals of PZT, which is one of materials having the most excellent piezoelectric property, the produced PZT can substitute for the conventional piezoelectric polycrystal and materials for single crystals in various application fields.

Grain growth takes place during the step of sintering polycrystals, in which case only a few grains are sometimes rapidly grown in an abnormal manner relative to the most normal grains.

It is appreciated that controlling the growth of such a few abnormal grains in polycrystals may allow single crystal to be easily produced without a melting process.

A general method for single crystal growth using the melting process is called Liquid-state Single Crystal Growth (LSCG) method, and a method for single crystal growth by heat treatment of polycrystals is referred to as Solid-state Single Crystal Growth (SSCG) method. The SSCG method has been suggested since the 1950's and demonstrated as an effective method of preparing single crystals of a metal, which is limited to only a few types. It is however reported that the method has a difficulty in preparing single crystals large enough for practical use from an oxide, because the growth is too slow in grain growth and hard of controlling nucleation of abnormal grains.

Since the emergence of the Flux method for single crystal growth of barium titanate, the subsequent methods for single crystal growth of barium titanate have been developed such as Zone Melting method and the Top-Seeded Solution Growth (TSSG) method. The single crystals of barium titanate grown by the Flux method have a thickness of less than 1 mm and a diameter of several millimeters and thus actually restrained in practical uses. It is known that the TSSG method, which has the advantages of the Flux method and the Czochralski method, is applicable to the growth of relatively large single crystals of barium titanate almost without residual stress. However, the TSSG method also requires complicated facilities and skilled functions and is inadequate as a method for preparing a large amount of single crystals at low costs.

Meanwhile, there has been made an attempt to obtain single crystals by subjecting polycrystals of ferrite, barium titanate [$BaTiO_3$], aluminum oxide [$Al_2O_3$] and PMN-PT to heat treatment through Solid-State Single Crystal Growth (SSCG) Method. This method for single crystal growth involves sintering a powder impregnated with single crystals as seed single crystals or providing an interface between the polycrystals and the seed single crystals, followed by heat treatment.

Disadvantageously, the method is not suitable to preparing single crystals large enough for practical uses such as more than several mm because the growth of single crystals is retarded relative to the conventional Liquid-State Single Crystal Growth methods.

Even though single crystals are produced by using abnormal grain growth phenomenon occurring in the polycrystal, it is difficult to continue to grow single crystals because the abnormal grains of the polycrystal repress the growth of the seed single crystals when the growing seed single crystals meet peripheral abnormal grains. Therefore, the conventional Solid-State Single Crystal Growth(SSCG) method is less advantageous than the conventional Liquid-State Single Crystal Growth method, in that it is difficult to produce single crystals having an actually applicable large size and the reproduction possibility is low because it is impossible to control the abnormal grain growths occurring inside the polycrystal by the method. In particular, in the case of PMN-PT, it is difficult to produce single crystals having a size of more than several mm because of the trouble in the control of abnormal grain growths in the polycrystal.

For single crystal growth of barium titanate [$BaTiO_3$], there is reported a method for preparing single crystals by adding particles having a (111) double twin plate or a seed forming agent to form a (111) double twin plate.

However, this method also has problems that it cannot produce single crystals without a (111) double twin plate and cannot produce in large quantities single crystals large enough for practical use at low costs because it is difficult to control secondary abnormal grain growth, create a single crystal and continue to grow only the single crystal.

SUMMARY OF THE INVENTION

It is, therefore, an object of the present invention to overcome the problems of the conventional single crystal growth methods (i.e., liquid-state single crystal growth methods and the conventional solid-state single crystal growth methods) and to provide a method for growing single crystals of undoped barium titanate, barium titanate solid solution, various perovskite oxides, including Pb-type perovskite such as $PbTiO_3$ (PT), $Pb(Zr_xTi_{1-x})O_3$(PZT), $Pb(Mg_{1/3}Nb_{2/3})O_3$(PMN), (1–x)PMN–xPT, $Pb(Zn_{1/3}Nb_{2/3})O_3$(PZN) or (1–x)PZN–xPT and perovskite oxides solid solution through a specific Solid-State Single Crystal Growth(SSCG) Method without requiring a melting process contrary to the liquid-state single crystal growth method, wherein it is possible to produce single crystals in large quantities at low costs with high reproduction possibility without a special apparatus.

To achieve the object of the present invention, there is provided a method for growing single crystals of perovskite oxides characterized in that for growing single crystals of perovskite oxides which shows primary and secondary abnormal grain growths according to temperature condition higher than a determined temperature or an atmosphere of heat treatment etc., a perovskite seed single crystal is adjoined to a polycrystal of perovskite oxides and then the adjoined combination is heated and, also, so as to make the seed single crystal grow into the polycrystal at the interface between the seed single crystal and the polycrystal and to repress secondary abnormal grain gowths inside the polycrystal, 1) the composition ratio of the polycrystal is controlled and/or the specific component(s) of the polycrystal is(are) added in an excess amount compared to the amount of the component(s) of original composition of the polycrystal, 2) said heat treatment is performed in the range of temperature which is over primary abnormal grain growths completion temperature and below secondary abnormal grain growths activation temperature, thereby allowing the seed single crystal to grow continuously.

DETAILED DESCRIPTION OF THE PREFERRED EMBODIMENTS

Hereinafter, preferred embodiments of a method for growing single crystals of perovskite oxides according to the present invention will be described in detail with reference to the accompanying drawings.

A method for growing single crystals of perovskite oxides according to this invention includes adjoining a perovskite seed single crystal to a polycrystal of perovskite oxides, which is controlled in its composition ratio and/or in the added amount of its specific component(s), and then heating the combination of the seed single crystal and the polycrystal in the range of temperature which is over primary abnormal grain growths completion temperature and below secondary abnormal grain growths activation temperature, thereby repressing secondary abnormal grain growths in the polycrystal and allowing the seed single crystal to continue to grow into the polycrystal through the phenomenon of the secondary abnormal grain growths at the interface between the seed single crystal and the polycrystal. The single crystal obtained by the above method has the same composition as original polycrystal and the same structure as the seed single crystal.

This single crystal is herein referred to "a single crystal having the composition of the polycrystal".

The single crystals having various compositions produced according to this invention can be used as a seed single crystal in another method. In other words, single crystals can be produced by adjoining a single crystal produced according to this invention to a polycrystal, and then allowing a single crystal having the same structure as the seed single and the same composition as the polycrystal to continue to grow. This recycling of single crystals can reduce the costs for production of single crystals.

Figure 1:
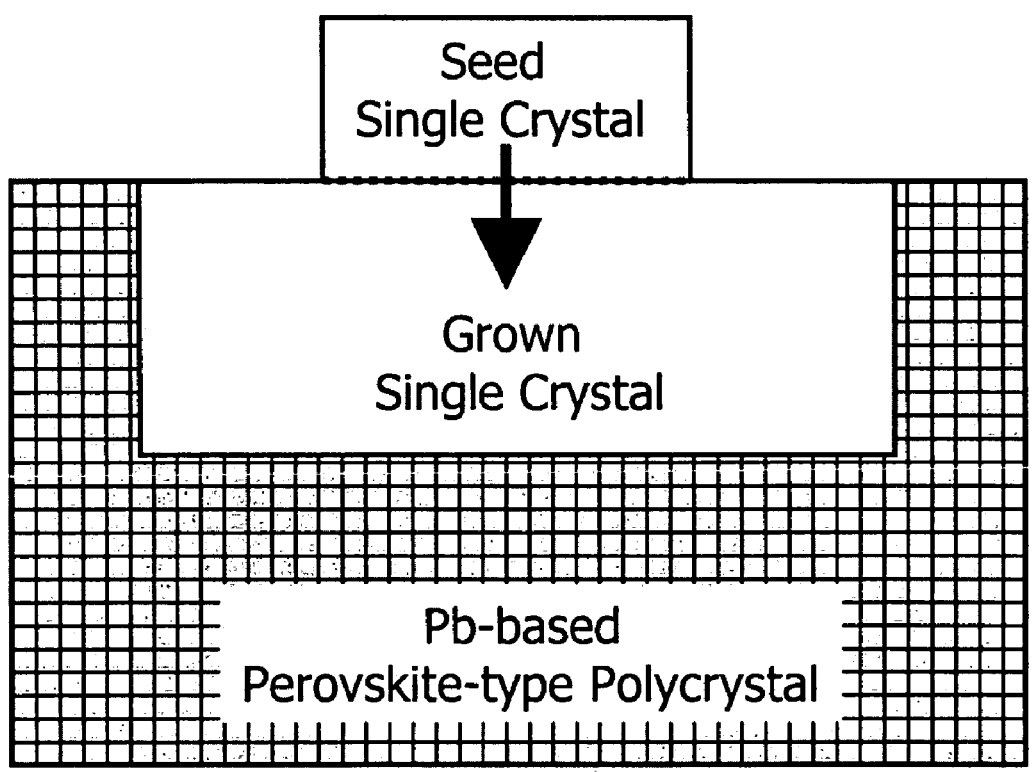
FIG. 1 is an illustration showing a perovskite seed single crystal adjoined to a polycrystal of perovskite oxides in the method of the present invention.

FIG. 1 is an illustration showing a perovskite seed single crystal (the primary seed single crystal is a single crystal of barium titanate) adjoined to a polycrystal of perovskite oxides in the method of the present invention.

As shown in FIG. 1, the adjoining of a seed single crystal to a polycrystal includes placing the seed single crystal on the polycrystal or the powder molded body, embedding the seed single crystal in the powder molded body, or embedding the combination of the seed single crystal and the polycrystal in the powder molded body.

Further, the method according to this invention is characterized in that the growth of the seed single crystal is promoted by using a plate-shaped or a "L"-shaped seed single crystal and thus increasing the number of the adjoined side of the polycrystal and the seed single crystal.

In perovskite oxides, including Pb-type perovskite oxides, whether the phenomenon of primary abnormal grain growths and secondary abnormal grain growths takes place is depending on the variables of composition changes of powders, temperature changes, formations of temperature gradients, atmosphere of heat treatment (partial pressure of $O_2$ in an atmosphere of heat treatment, etc.) or local additions of additives during heat treatment, etc.

In addition, primary and secondary abnormal grain growths activation temperature, the size and the number of the abnormal grains are affected by the variables of composition changes of powders, temperature changes, formations of temperature gradients, atmosphere of heat treatment (partial pressure of $O_2$ in an atmosphere of heat treatment, etc.) or local additions of additives during heat treatment, etc.

In the method according to this invention, the criterion controlling said variables is set so as to produce single crystals in large quantities at low costs with high reproduction possibility.

That is, in the method according to this invention, so as to repress secondary abnormal grain growths in the polycrystal and, to the contrary, to allow the seed single crystal to continue to grow at the interface between the seed single crystal and the polycrystal (through secondary abnormal grain growths), the variables of composition changes of powders, temperature changes, formations of temperature gradients, atmosphere of heat treatment (partial pressure of $O_2$ in the atmosphere of heat treatment, etc.) or local additions of additives during heat treatment are controlled, In particular, so as to repress secondary abnormal grain growths in the polycrystal and, to the contrary, to allow the seed single crystal to continue to grow at the interface between the seed single crystal and the polycrystal (through secondary abnormal grain growths), the composition ratio of the polycrystal is controlled and/or the specific component(s) of the polycrystal is(are) added in excess amount compared to the amount of the component(s) of original composition of the polycrystal and, simultaneously, the heat treatment is performed in the range of temperature which is over primary abnormal grain growths completion temperature and below secondary abnormal grain growths activation temperature.

Further, the abnormal grain growths are controlled by continuing to heat the combination of the seed single crystal and the polycrystal such that the temperature of the interface of the seed single crystal and the polycrystal is higher than the temperature of the polycrystal inside, and thus the growth at the interface between the seed single crystal and the polycrystal is induced and the secondary abnormal grain growths inside the polycrystal are repressed.

Further, additives for lowering secondary abnormal grain growths activation temperature are added to the interface between the seed single crystal and the polycrystal.

That is, if additives for lowering the temperature activation secondary abnormal grain growths are added and then heat treatment is performed under the condition that secondary abnormal grain growths are repressed inside the polycrystal, but secondary abnormal grain growths take place in the local part wherein the additives are added, the seed crystal continues to grow inside the polycrystal and so a single crystal having a large size enough for a practical use is produced.

Said additives, which is for promoting the secondary abnormal grain growths locally by lowering the secondary abnormal grain growth activation temperature locally, are preferably one or more additives selected from the group consisting of $Al_2O_3$, $B_2O_3$, CuO, $GeO_2$, $Li_2O_3$, $P_2O_5$, PbO, $SiO_2$ and $V_2O_5$.

The method for single crystal growth according to this invention has characteristic features that a perovskite single crystal having a large size of more than several cm is produced by controlling secondary abnormal grain growths in different ways at the interface between a seed single crystal and a polycrystal and inside the polycrystal respectively, and is produced by adjoining the single crystal prepared by above method as a seed single crystal to a polycrystal and then heating so that a single crystal having the seed crystal in the polycrystal continues to grow.

In the method according to this invention, it is preferable that said heat treatment is performed in the range of the temperature between primary abnormal grain growths completion temperature and secondary abnormal grain growths activation temperature and, more preferably, at the temperature just a little less than the secondary abnormal grain growths activation temperature, for example, at the temperature within $-10°$ C. of the secondary abnormal grain growths activation temperature and, further more preferably, at the temperature immediately before the secondary abnormal grain growths activation temperature.

Through the heat treatment performed in this range of temperature, only the seed single crystal can be grown while secondary abnormal grain growths of single crystals other than the seed single crystal are repressed.

In the method according to this invention, the polycrystal of perovskite oxides is characterized in that one or more additives selected from the group consisting of BaO, $Bi_2O_3$, CaO, CdO, $CeO_2$, CoO, $Cr_2O_3$, $Fe_2O_3$, $HfO_2$, $K_2O$, $La_2O_3$, MgO, $MnO_2$, $Na_2O$, $Nb_2O_5$, $Nd_2O_3$, NiO, PbO, $Sc_2O_3$, $SmO_2$, $SnO_2$, SrO, $Ta_2O_5$, $TiO_2$, $UO_2$, $Y_2O_3$, ZnO, and $ZrO_2$ are added to the polycrystal so that the additives and the polycrystal may be in the form of solid solution.

Further, the method according to this invention is characterized by further comprising the steps of, prior to the adjoining of the seed single crystal to the polycrystal, predetermining the crystal orientation of the seed single crystal, grinding a specific crystal face of the seed single crystal in the crystal orientation determined, and adjoining the ground seed single crystal to the polycrystal to determine the crystal orientation of a single crystal to be grown in the polycrystal from the seed single crystal. This is based on that a single crystal to be grown in a polycrystal has the same crystal orientation as the seed single crystal.

A single crystal grown from a seed single crystal into a polycrystal has the same shape as the polycrystal. Based on this theory, the method according to this invention is characterized by further comprising the step of: prior to the adjoining of the seed single crystal to the polycrystal, molding the polycrystal powder to a specific shape which is intented or processing the polycrystal into a complicated shape, and then adjoining the shaped polycrystal to the seed single crystal, to produce a single crystal having a specific complicated shape which is intented without a expensive and complicated separate step for processing the single crystal.

Further, in the method according to this invention, the secondary abnormal grain growth are induced at the interface between the seed single crystal and the polycrystal and the secondary abnormal grain growths are repressed inside the polycrystal by controlling the composition of the polycrystal, the temperature, the temperature gradient and atmosphere, etc. In addition, the porosity and the pore shape of the polycrystal are controllable depending on heating temperature, heating atmosphere (e.g., air, oxygen or vacuum), heating pressure, the amount of liquid phase and additives. And, the polycrystals of various porosities and pore shapes make it possible to produce a single crystal having various pore structures. In addition, a single crystal in the perfectly dense polycrystal can be grown into a large amount of perfectly dense single crystals free from pores.

Further, in the method according to this invention, for the increasement of the effect according to the invention, the polycrystal of the perovskites oxides is heat-treated under the atmosphere that abnormal grain growths are repressed, for example, under a reductive atmosphere, before and/or during the heat treatment for the growth of the seed single crystal.

That is, before the heat treatment for the growth of the seed single crystal, the polycrystal of the perovskites oxides is heat-treated in advance under a reductive atmosphere and, in this case, during the heat treatment for the growth of the seed single crystal, the polycrystal of the perovskites oxides may be heat-treated under an arbitary atmosphere (for example, an oxidative atmosphere, a reductive atmosphere etc.).

Meanwhile, before the heat treatment for the growth of the seed single crystal, the polycrystal of the perovskites oxides may not be heat-treated in advance, or be heat-treated in advance under an an arbitary atmosphere and, in this case, during the heat treatment for the growth of the seed single crystal, the polycrystal of the perovskites oxides is heat-treated under a reductive atmosphere.

As a matter of course, it is possible that before the heat treatment for the growth of the seed single crystal, the polycrystal of the perovskites oxides is heat-treated in advance under a reductive atmosphere and, in this case, during the heat treatment for the growth of the seed single crystal, the polycrystal of the perovskites oxides is heat-treated under a reductive atmosphere.

Further, single crystals of perovskite oxides, e.g., barium titanate solid solution $((Ba_{1-x},M_x)(Ti_{1-y},N_y)O_3)$ [M and N are elements of solid solute (0 x 1, 0 y 1)], Pb-type perovskites $((1-x) [Pb(Mg_{1/3}Nb_{2/3})O_3]$-x$[PbTiO_3]$ (0 x 1) (PMN-PT); PMN-PT solid solution; $Pb(Zr_xTi_{1-x})O_3$ (0 x 1) (PZT); PZT solid solution; (1-x-y) $[Pb(Mg_{1/3}Nb_{2/3})O_3]$-x $[PbTiO_3]$-y$[PbZrO_3]$ (0 x 1; 0 y 1; 0 x+y 1) (PMN-PT-PZ); PMN-PT-PZ solid solution; (1-x-y) $[Pb(Yb_{1/2}Nb_{1/2})O_3]$-x $[PbTiO_3]$-y$[PbZrO_3]$ (0 x 1; 0 y 1; 0 x+y 1) (PYbN-PT-PZ); PYbN-PT-PZ solid solution; (1-x-y) $[Pb(In_{1/2}Nb_{1/2})O_3]$-x $[PbTiO_3]$-y$[PbZrO_3]$ (0 x 1; 0 y 1; 0 x+y 1) (PIN-PT-PZ); PIN-PT-PZ solid solution; (1-x-y) $[Pb (Mg_{1/3}Nb_{2/3})O_3]$-x $[Pb(Yb_{1/2}Nb_{1/2})O_3]$ -y$[PbTiO_3]$ (0 x 1; 0 y 1; 0 x+y 1) (PMN-PYbN-PT); PMN-PYbN-PT solid solution; (1-x-y) $[Pb (Mg_{1/3}Nb_{2/3})O_3]$-x $[Pb (In_{1/2}Nb_{1/2})O_3]$-y $[PbTiO_3]$ (0 x 1; 0 y 1; 0 x+y 1) (PMN-PIN-PT) and PMN-PIN-PT solid solution etc.) and Pb-type perovskite oxides solid solution, etc. can be produced in large quantities at low costs by using a large single crystal of barium titanate having a size of more than 20 20 mm as a seed single crystal, though the produced single crystals have different compositions from that of the seed single crystal.

Also, in the method according to this invention, single crystals of perovskite oxides can be produced in large quantities at low costs by adjoining the perovskite single seed crystal including the crystal defects of (111) double twin, (111) single twin, dislocations to the polycrystal, etc.

Hereinafter, preferred embodiments of a method according to the present invention will be described in detail.

Following Examples 1 to 8 relate to observations of primary abnormal grain growths and secondary abnormal grain growths induced by heating polycrystals of $(1-x)Pb(Mg_{1/3}Nb_{2/3})O_3$-$(x)PbTiO_3$ type oxides, which have a particularly excellent piezoelectric property among single crystals of Pb-type perovskite oxides, with a change of the composition ratio of the polycrystal or with an addition of an extra specific component.

Firstly, $(1-x)Pb(Mg_{1/3}Nb_{2/3})O_3$-$(x)PbTiO_3$ powder was prepared by the Columbite precursor method. The preparing process of the powder was as follows:

Magnesium niobate $(MgNb_2O_6)$ was prepared by ball-milling magnesium carbonate hydroxide $(4MgCO_3.Mg(OH)_2. 4H_2O)$ and niobium oxide $(Nb_2O_5)$ powders in ethanol, and then calcining them at 1100 for 4 hours.

Finally, $(1-x)Pb(Mg_{1/3}Nb_{2/3})O_3$-$(x)PbTiO_3$ powder was prepared by mixing the calcined magnesium niobate with PbO and $TiO_2$ powder, ball-milling the mixture and then calcining it at 850 for 4 hours. $(1-x)Pb(Mg_{1/3}Nb_{2/3})O_3$-$(x)PbTiO_3$ powders having different x values in the composition formula were prepared by controlling the ratio of magnesium niobate and titanium dioxide.

Powder molded bodies (the diameter: 10 mm, height: 2 mm) were prepared by uniaxial pressure molding. Then, the powder molded bodies were subjected to CIP(Cold Isostatic Pressing) at the pressure of 200 MPa.

They were sintered on a platinum(Pt) plate in double platinum crucibles in the range of temperature between 800 and 1300, and atmosphere powders such as lead zirconate $(PbZrO_3[PZ])$ and PbO powder were placed around the sample to repress the volatilization of PbO during sintering.

EXAMPLE 1

Figure 2A:
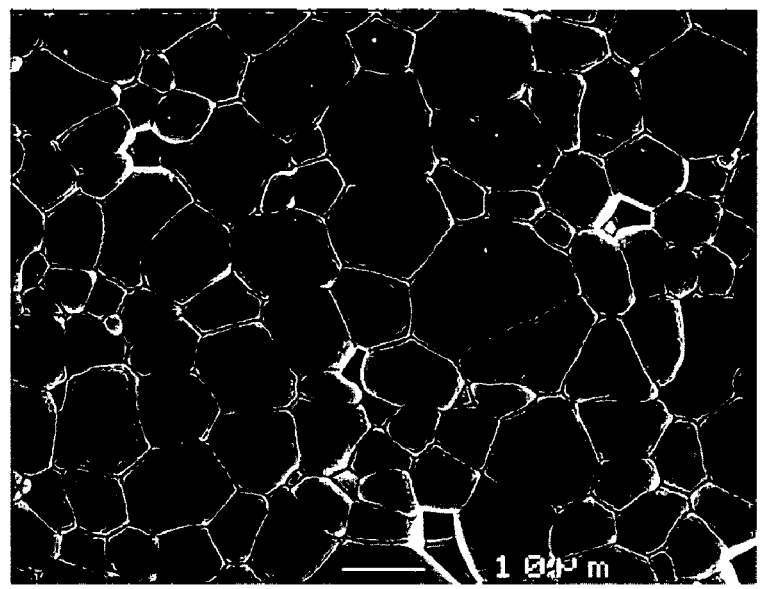
FIG. 2 is microscopic photographs of samples obtained by sintering (a) a powder molded body having the composition formula of (0.68)$Pb(Mg_{1/3}Nb_{2/3})O_3$-(0.32)$PbTiO_3$ and (b) a powder molded body having the composition formula of (0.5)$Pb(Mg_{1/3}Nb_{2/3})O_3$-(0.5)$PbTiO_3$, at 1200° C. for 10 hours.
Figure 2B:
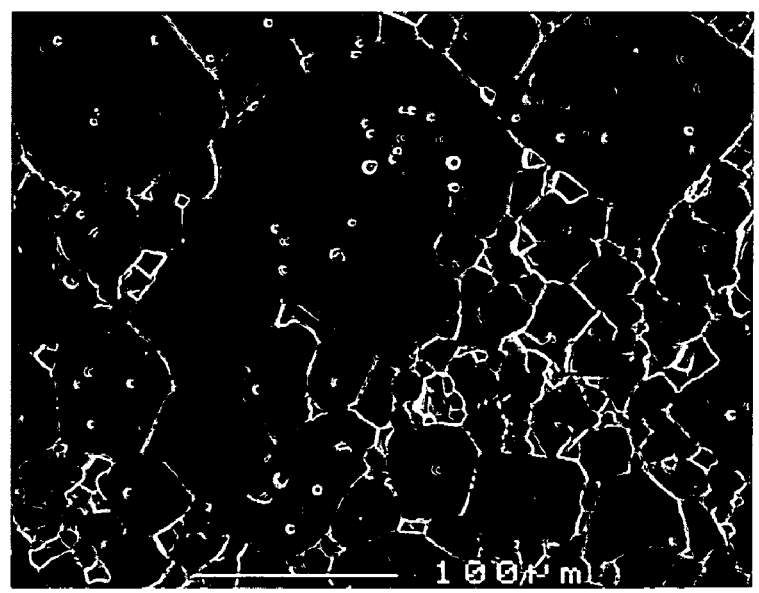

FIG. 2 is microscopic photographs of samples obtained by sintering (a) a powder molded body having the composition formula of $(0.68)Pb(Mg_{1/3}Nb_{2/3})O_3$-$(0.32)PbTiO_3$ and (b) a powder molded body having the composition formula of $(0.5)Pb(Mg_{1/3}Nb_{2/3})O_3$-$(0.5)PbTiO_3$, at 1200° C. for 10 hours.

These results demonstrate that the types of grain growths are changed according to the x value of $(1-x)Pb(Mg_{1/3}Nb_{2/3}) O_3$-$(x)PbTiO_3$. normal grain growths with a uniform distribution of grain sizes occur in the case of (a), i.e., x=0.32(PMN/PT=63/32), while secondary abnormal grain growths occur in the case of (b), i.e., x=0.5(PMN/PT=5/5).

In other words, secondary abnormal grain growths occur when x value in the composition formula of $(1-x)Pb(Mg_{1/3}Nb_{2/3})O_3$-$(x)PbTiO_3$, i.e., the ratio of $PbTiO_3$, is more than a specific value.

Especially, whether secondary abnormal grain growths occur was decided near the value of x=0.4.

Therefore, in order to observe the effect according to the change of composition ratio near the value of x=0.4 during a heat treatment at a specific temperature, the seed single crystals of $BaTiO_3$, all of which have the same size in their initial seed single crystals, were embedded respectively in powders having several x values near the value of x=0.4, such as the values of x=0.32, x=0.4 and x=0.5 in their composition, and then heat-treated at 115° C. for 50 hours.

As a result, in case of the value of x=0.4, the seed single crystal grew most rapidly to the size of 1 cm or more.

However, in case of the value of x below 0.4, the seed single crystal grew very slowly. And, in case of the value of x over 0.4, secondary abnormal grain growths occur, but the seed single crystal did not grow (the size of the seed single crystal=0).

Viewing the growth speed of the seed single crystals compared in the (110) face, in which a seed single crystal comes to grow rapidly, in case of the value of x=0.4, the seed single crystal grew most rapidly at the speed of about 30 um/h. But, in case of the value of x below 0.4, the seed single crystal grew very slowly because the abnormal grain growths did not occur. And, in case of the value of x over 0.4, due to the encounter with the abnormal grains occurred, the seed single crystal did not grow.

EXAMPLE 2

In $(1-x)Pb(Mg_{1/3}Nb_{2/3})O_3-(x)PbTiO_3$ type, MPB(Morphotropic Phase Boundary), which is a boundary of a tetragonal phase and a rhombohedral phase has a composition close to the composition of $(0.68)Pb(Mg_{1/3}Nb_{2/3})O_3-(0.32)PbTiO_3$. It was reported that the MPB composition shows an excellent piezoelectric property. In this Example, a powder having the MPB composition of $(0.68)Pb(Mg_{1/3}Nb_{2/3})O_3-(0.32)PbTiO_3$ was prepared by the Columbite precursor method according to Example 1. However, contrary to Example 1, excess Mg, Pb, Nb and Ti, respectively, were added during the preparation of the powder. The results were shown in FIG. 3 and FIG. 4.

Figure 3:
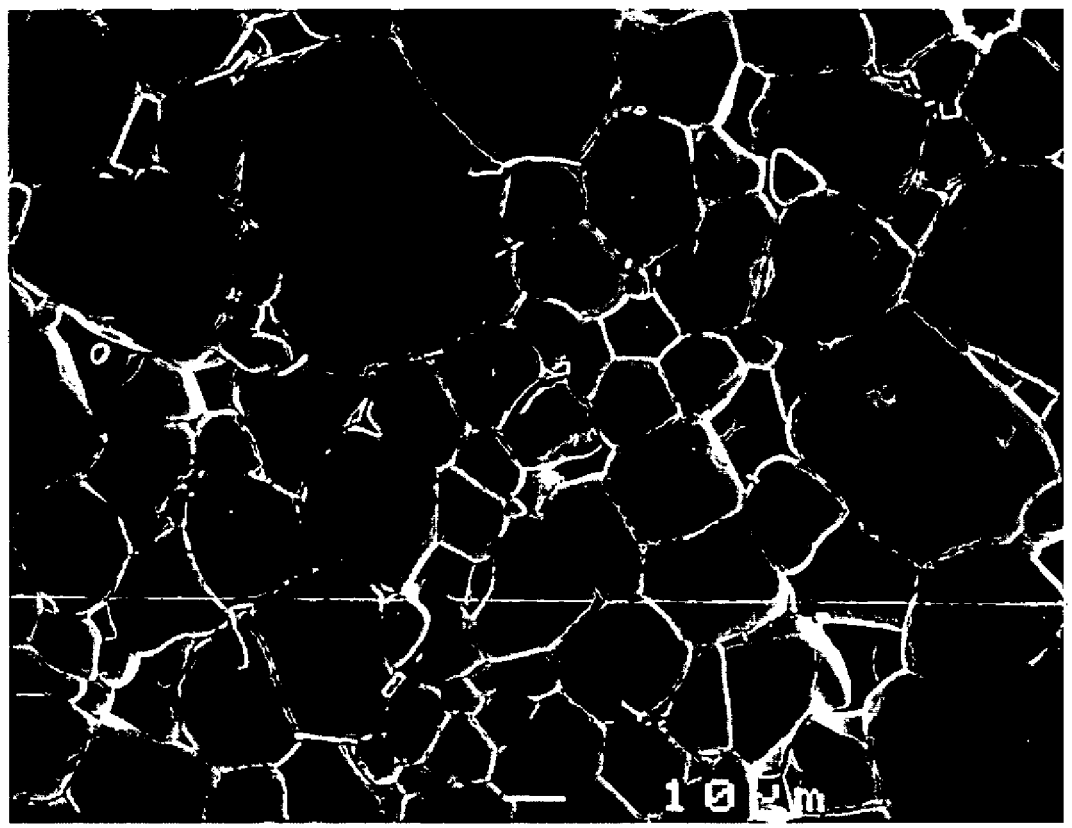
FIG. 3 is a microscopic photograph of a sample obtained by sintering a powder molded body having the composition formula of (0.92) [(0.68)$Pb(Mg_{1/3}Nb_{2/3})O_3$-(0.32) $PbTiO_3$]-(0.08)MgO, at 1200° C. for 10 hours.

FIG. 3 is a microscopic photograph of a sample obtained by sintering a powder molded body having the composition formula of $(0.92) [(0.68)Pb(Mg_{1/3}Nb_{2/3})O_3-(0.32)PbTiO_3]-(0.08)MgO$, at 1200° C. for 10 hours.

This composition further comprises the extra MgO of 8 mol % relative to the original composition of $(0.68)Pb(Mg_{1/3}Nb_{2/3})O_3-(0.32)PbTiO_3$. When an excess MgO was not added or the amount of the added MgO is slight, normal grain growths occurred. But, when an excess MgO of more than a specific amount was added, secondary abnormal grain growths occurred as shown in FIG. 3. The determination of whether the secondary abnormal grain growths occur is based on that the abnormal grains is three times as large as the average size of matrix grains and the abnormal grains show bimodal distribution of grain sizes.

Figure 4A:
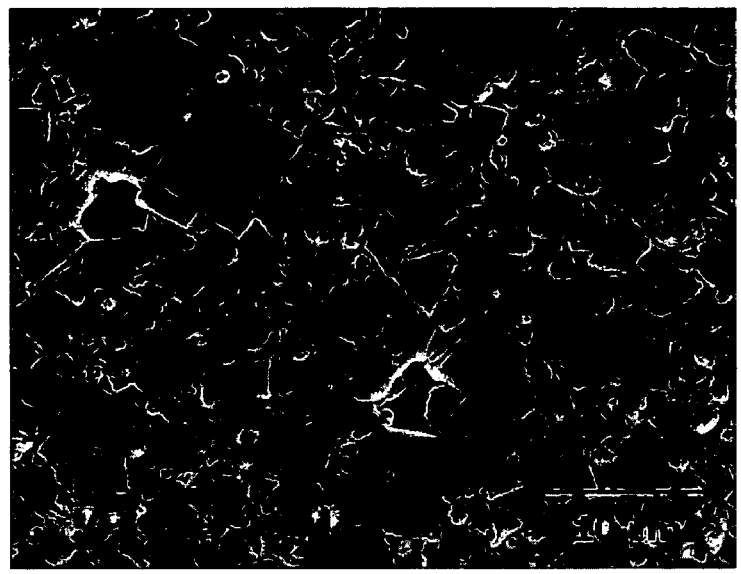
FIG. 4 is microscopic photographs of samples obtained by sintering a powder molded body having the composition formula of (0.92) [(0.68)$Pb(Mg_{1/3}Nb_{2/3})O_3$-(0.32)$PbTiO_3$]-(0.08)PbO, at (a) 950° C. for 10 hours and (b) 1200° C. for 10 hours.
Figure 4B:
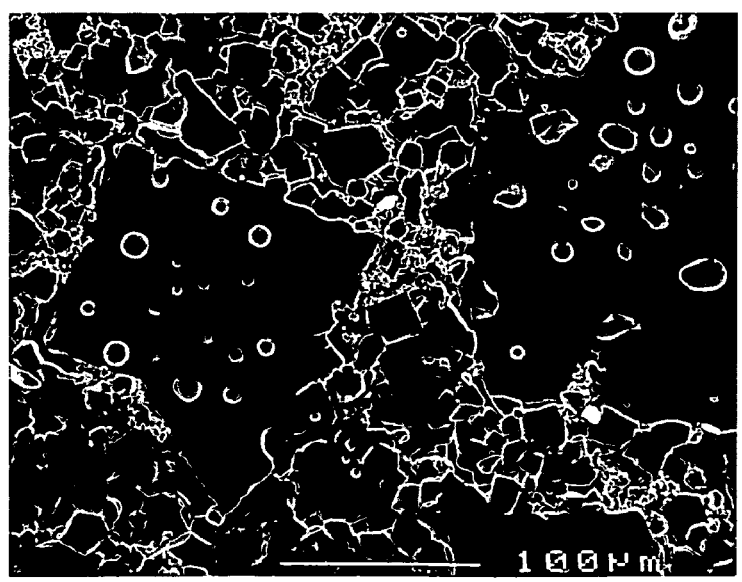

FIG. 4 is microscopic photographs of samples obtained by sintering a powder molded body having the composition formula of $(0.92) [(0.68)Pb(Mg_{1/3}Nb_{2/3})O_3-(0.32)PbTiO_3]-(0.08)PbO$, at (a) 950° C. for 10 hours and (b) 1200° C. for 10 hours.

As shown in FIG. 4(a), it was observed that the grains which are five or more times as large as the average size of the matrix grains appeared in the samples sintered at 950° C. and, therefore, it came to knowledge that abnormal grain growths took place. And, in case of sintering the samples having the same composition as that of the samples of FIG. 4(a) at 1200° C., it was observed that the grains which are five or more times as large as the average size of the matrix grains appeared again and, therefore, it came to knowledge that abnormal grain growths took place repeatedly.

As described above, in case that abnormal grain growths take place repeatedly according to the increasement of temperature, these abnormal grain growths may be classified into two groups of primary abnormal grain growths and secondary abnormal grain growths according to the order of their respective occurrences.

In case of PMN-PT powder added with excess PbO, it was observed according to the increasement of temperature that the primary abnormal grain growths take place at first and, next, the secondary abnormal grain growths take place after the completion of the primary abnormal grain growths.

When an excess PbO was not added or the amount of the added PbO was slight, normal grain growths occurred like the preceding FIG. 2(a). But, when an excess PbO was added, primary and secondary abnormal grain growths occurred as shown in FIG. 4. As the amount of the added PbO increases, the average size of the abnormal grains increases and the number of the abnormal grains per unit area decreases.

An abnormal grain growth did not occur when an excess Nb and Ti were added to $(0.68)Pb(Mg_{1/3}Nb_{2/3})O_3-(0.32)PbTiO_3$ powder, and then the powder was heated. This result demonstrates that the excess addition of only specific components among components of a polycrystal can induce the abnormal grain growth.

Figure 5:
FIG. 5 is a microscopic photograph of a sample obtained by placing a seed single crystal of $BaTiO_3$ in powder having the composition formula of (0.92) [(0.68)$Pb(Mg_{1/3}Nb_{2/3})O_3$-(0.32)$PbTiO_3$]-(0.08)MgO, and sintering the combination at 950° C. for 100 hours.

FIG. 5 is a microscopic photograph of a sample obtained by embedding a seed single crystal of of $BaTiO_3$ in powder having the composition formula of $(0.92) [(0.68)Pb(Mg_{1/3}Nb_{2/3})O_3-(0.32)PbTiO_3]-(0.08)MgO$, and sintering the combination at 950° C. for 100 hours;

As shown in FIG. 5, the seed single crystal was not grown when adjoined with the polycrystal and then heated under the condition that primary abnormal grain growths occur. Under this condition, there were too many abnormal grains and the seed single crystal could not be grown because the encounters between the abnormal grains and the seed single crystals blocked the growth of the seed single crystal. Thus, this result shows that it is very difficult to grow the seed single crystal in a large size by using the usual and conventional primary abnormal grain growths

EXAMPLE 3

The above Examples 1 and 2 show that abnormal grain growths occur when x value of the composition formula of $(1-x)Pb(Mg_{1/3}Nb_{2/3})O_3-(x)PbTiO_3$ type is more than a specific value, i.e., when the composition ratio of the components of the polycrystal is changed or a specific component of the polycrystal such as MgO or PbO is added in excess.

This Example relates to the observation of the behaviors of the grain growths occurring when the Mg contents of a powder are higher or lower than that of the original composition of $(0.68)Pb(Mg_{1/3}Nb_{2/3})O_3-(0.32)PbTiO_3$ powder to which an excess PbO was added. $(0.68)Pb(Mg_{1/3}Nb_{2/3})O_3-(0.32)PbTiO_3$ powders were prepared by the above Examples 1 and 2. The Mg contents of the powders are controlled from 15% Mg-deficient content to 15% Mg-extra content.

FIG. 6 is microscopic photographs of samples obtained by sintering powder molded bodies, which are (a) 2% Mg-deficient (−2Mg), (b) 1% Mg-deficient (−1Mg), (C) 0% Mg-deficient (0Mg) and (d) 1% Mg-extra (1Mg) in the composition formula of $(0.92) [(0.68)Pb(Mg_{1/3}Nb_{2/3})O_3-(0.32)PbTiO_3]-(0.08)PbO$, at 1200° C. for 10 hours.

Under the above respective conditions, the powders were heated.

As a result, secondary abnormal grain growths were observed only in the case of (b) and (c). In other words, secondary abnormal grain growths were observed in the case of 1% Mg-deficient composition and 0% Mg-deficient composition.

But, secondary abnormal grain growth did not occur and growth of matrix grains was very limited, when the Mg content was more deficient than 1% such as (a). Thus, both abnormal grain growths and matrix grain growths are repressed when the Mg content is lower than a specific value, i.e., the Nb content is excess.

Meanwhile, when an excess Mg was added such as in (d), the temperature of the secondary grain growths increased and, therefore, secondary grain growths did not occur in the polycrystal and uniform distribution of matrix grains was observed.

However, the secondary grain growths were observed when the temperature of heat treatment increased by 15° C. or more from 1200° C. even in case that an excess Mg was added such as in (d).

A seed single crystal of $BaTiO_3$ was placed in said powders of FIG. 6, followed by being heated at 1200 for 10 hours (see FIG. 7).

Figure 7A:
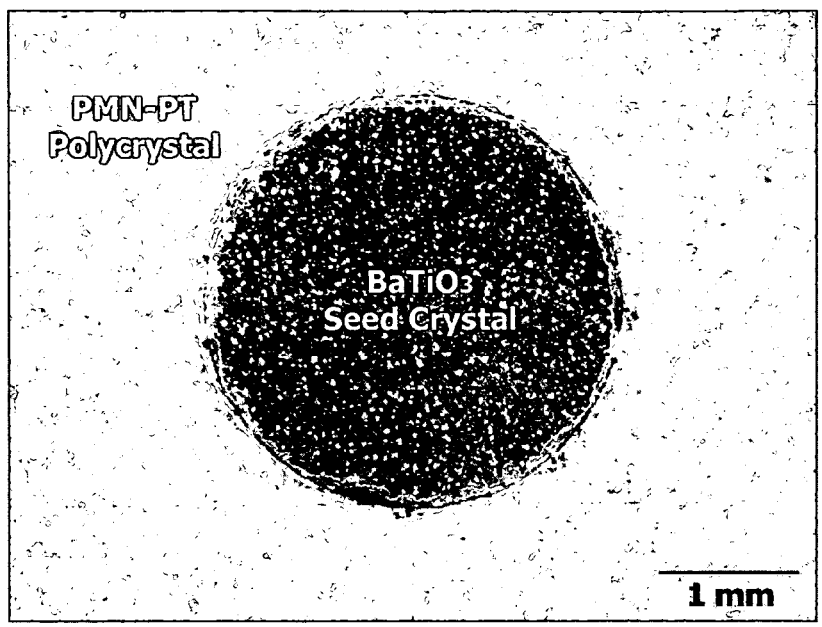
FIG. 7 is microscopic photographs of samples obtained by sintering powder molded bodies, which are (a) 2% Mg-deficient (−2Mg), (b) 1% Mg-extra (1Mg) in the composition formula of (0.92) [(0.68)Pb(Mg$_{1/3}$Nb$_{2/3}$)O$_3$-(0.32)PbTiO$_3$]-(0.08)PbO, at 1200° C. for 10 hours.

In FIG. 7(a), i.e., a composition of which the Mg content is more than 1% deficient, both an abnormal grain growth and a see ingle crystal growth did not occur.

Figure 6A:
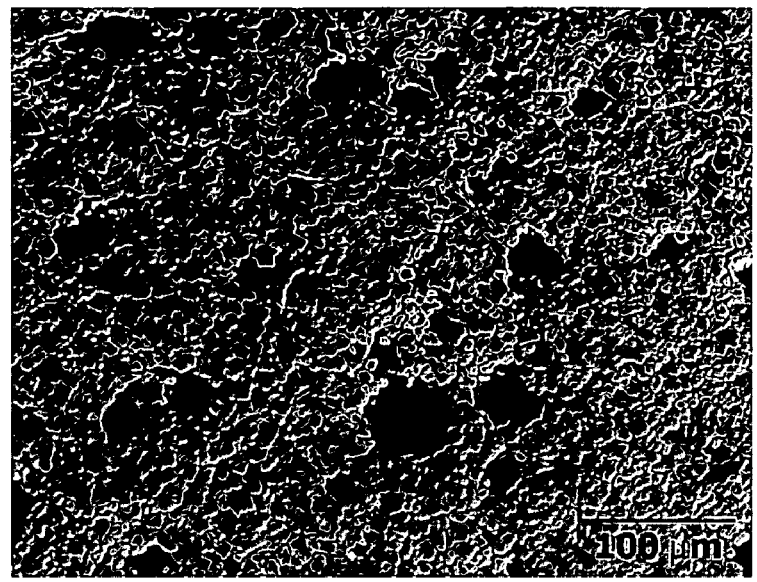
FIG. 6 is microscopic photographs of samples obtained by sintering powder molded bodies, which are (a) 2% Mg-deficient (−2Mg), (b) 1% Mg-deficient (−1Mg), (C) 0% Mg-deficient (0Mg) and (d) 1% Mg-extra (1Mg) in the composition formula of (0.92) [(0.68)$Pb(Mg_{1/3}Nb_{2/3})O_3$-(0.32)$PbTiO_3$]-(0.08)PbO, at 1200° C. for 10 hours.
Figure 6B:
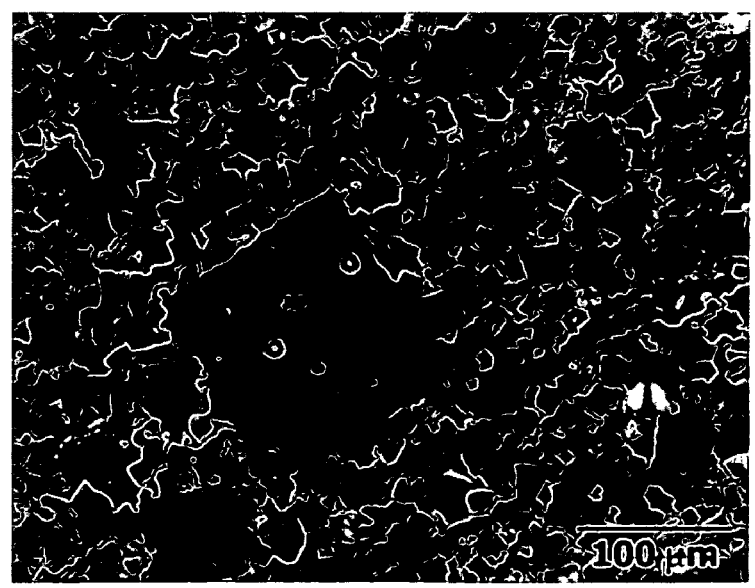
Figure 6C:
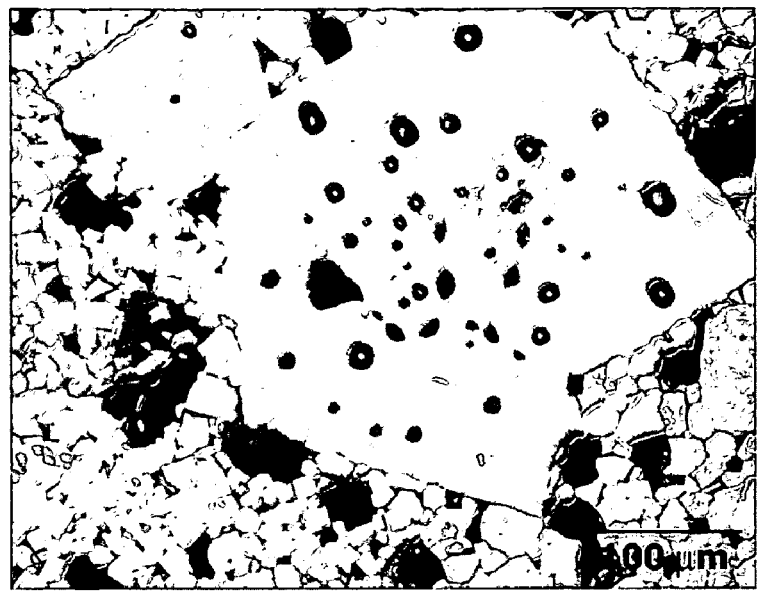
Figure 6D:
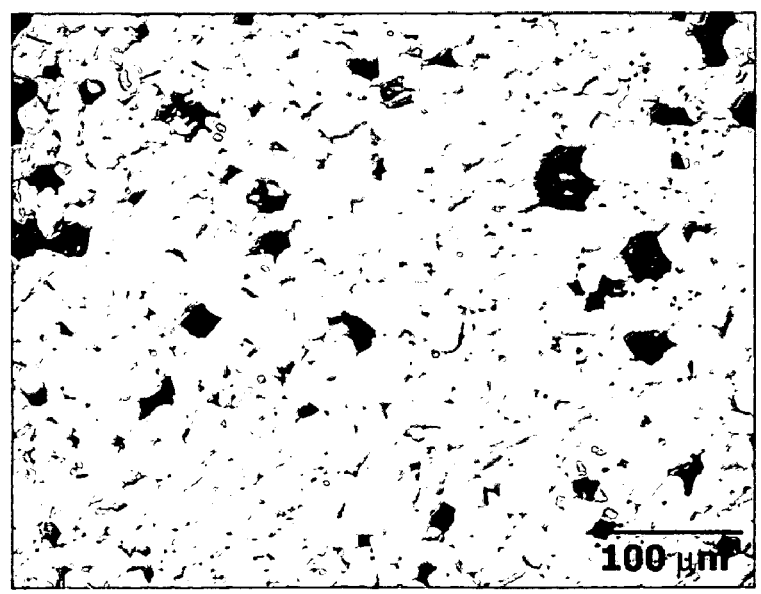

In cases of the samples of FIGS. 6(b) and 6(c), abnormal grain growths and a seed single crystal growth occurred with showing large size differences between the abnormal grains and the matrix grains. However, the abnormal grains blocked the seed single crystal growth when the abnormal grains met the seed single crystal. Therefore, the seed single crystal could not grow to more than a specific size and captured the abnormal grains. As a result, the quality of the seed single crystal became deteriorated.

Figure 7B:
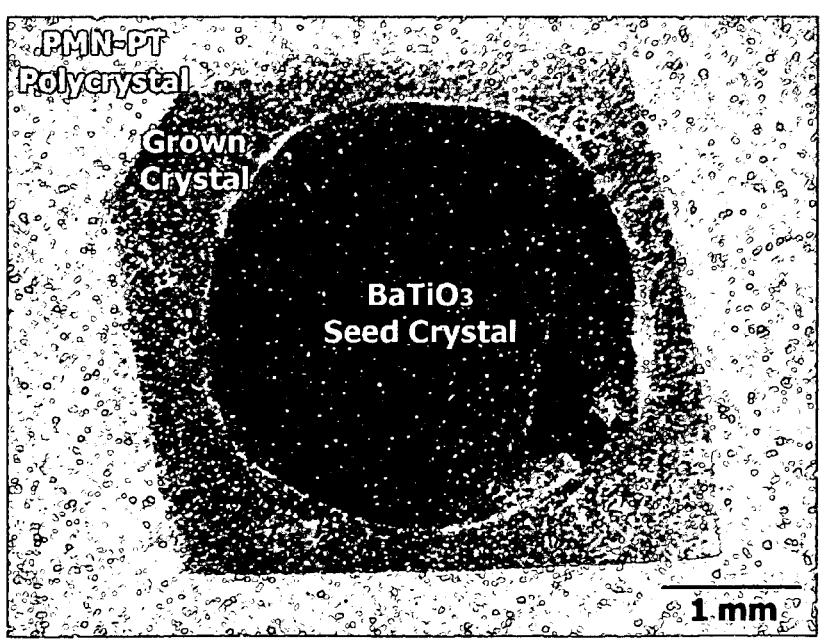

Meanwhile in FIG. 7(b), i.e., a composition of which the Mg content is more than 1% excess, the size distribution of matrix grains was uniform, and the secondary abnormal grain growths did not occur, and so the abnormal grains did not block the seed single crystal growth, and the seed single crystal rapidly grew. Also, the abnormal grains were not captured into the seed single crystal.

Therefore, it is necessary that both MgO and PbO of more than a specific amount must be added and the heat treatment must be performed at the temperature less than the secondary abnormal grain growth activation temperature, so as to grow effectively PMN-PT single crystal of MPB composition.

EXAMPLE 4

A growth rate of a seed single crystal in a polycrystal largely depends on the crystal orientation of the seed single crystal.

In this Example, (0.92) [(0.68)Pb($Mg_{1/3}Nb_{2/3}$)$O_3$-(0.32) $PbTiO_3$]-(0.08)PbO powder further comprising 1% excess Mg was prepared as shown in Example 3 and then a seed single crystal of $BaTiO_3$, which is a plate-shaped crystal having a different crystal orientation, was placed in the powder, followed by being heated.

Figure 8A:
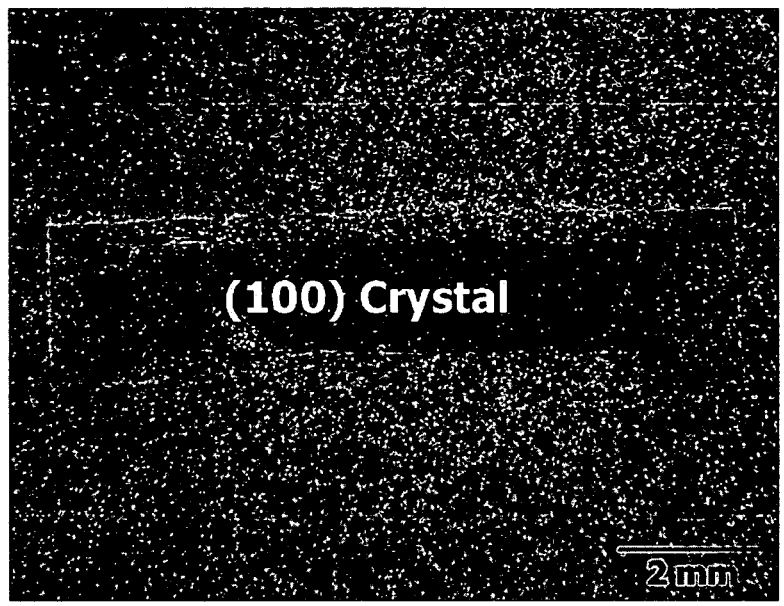
FIG. 8 is microscopic photographs of PMN-PT single crystals grown from samples obtained by embedding a seed single crystal of BaTiO$_3$, which is a plate-shaped crystal of (a) (100) side, (b) (110) side and (c) (111) side, in powder molded bodies further having 1% extra Mg (1Mg) in addition to the original Mg content in the composition formula of (0.92) [(0.68)Pb(Mg$_{1/3}$Nb$_{2/3}$)O$_3$-(0.32)PbTiO$_3$]-(0.08) PbO, and then heating the combination at 1200° C. for 10 hours.
Figure 8B:
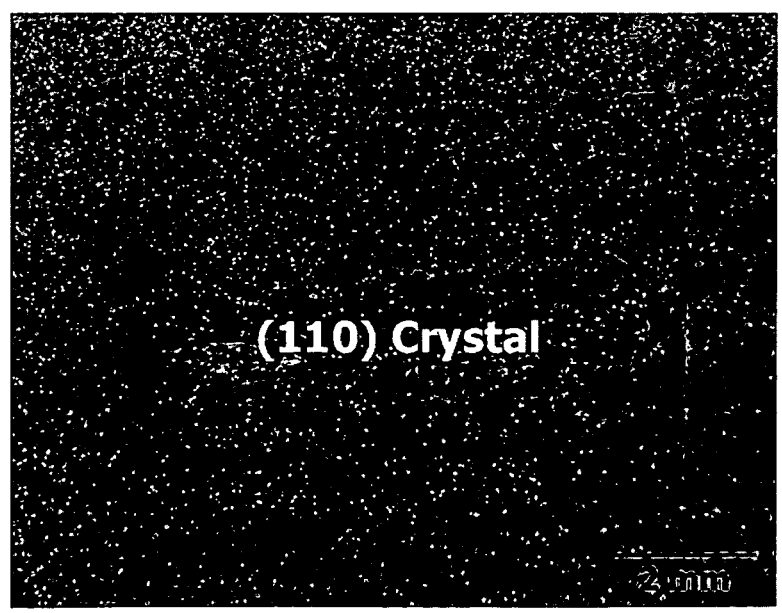
Figure 8C:
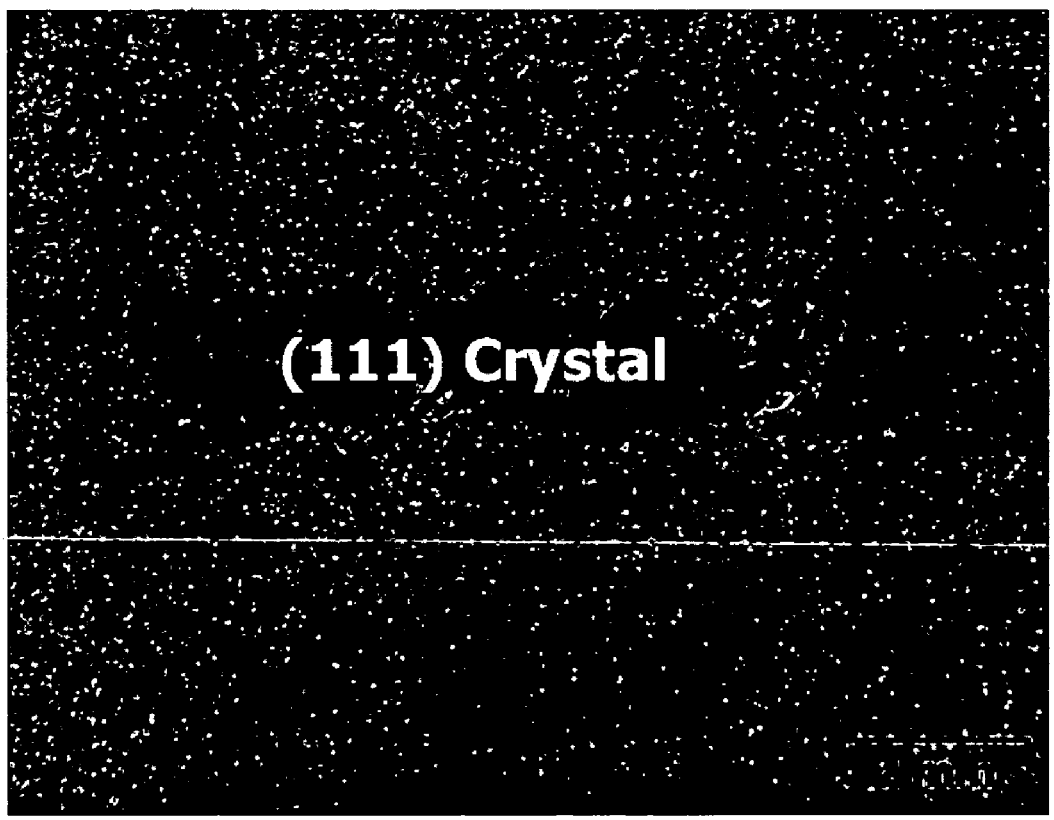

FIG. 8 is microscopic photographs of PMN-PT single crystals grown from samples obtained by embedding a seed single crystal of $BaTiO_3$, which is a plate-shaped crystal of (a) (100) side, (b) (110) side and (c) (111) side, in powder molded bodies further having 1% extra Mg (1Mg) in addition to the original Mg content in the composition formula of (0.92) [(0.68)Pb($Mg_{1/3}Nb_{2/3}$)$O_3$-(0.32)$PbTiO_3$]-(0.08) PbO, and then heating the combination at 1200° C. for 10 hours.

The photographs show the interface between the seed single crystal of $BaTiO_3$ and the grown PMN-PT single crystal. As shown in the photographs, though a single crystal of $BaTiO_3$ has a different composition from PMN-PT single crystal, the single crystal of $BaTiO_3$ functions as a seed single crystal to grow a PMN-PT crystal. The reason is that a single crystal of $BaTiO_3$ can continue to grow into a PMN-PT polycrystal because it is chemically stable in PbO-based liquid phase and the lattice constant thereof is similar to that of PMN-PT.

In FIG. 8(a), which used a single crystal of $BaTiO_3$ being a plate-shaped crystal of (100) side as a seed single crystal, the growth side maintains (100) side while the growth rate was very low such as 20 μm/h. Meanwhile, when single crystals of $BaTiO_3$ of (110) side and (111) side were used as a seed single crystal, the growth rate is higher than that of (100) side such as 100 to 300 μm/h. However, a triangle-shaped single crystal grew because the growth side could not be maintained, when (111) side was used. Thus, in this case, wide PMN-PT single crystal could not be produced. When (110) side was used, the growth rate is high and wide PMN-PT single crystal could be produced.

Figure 9:
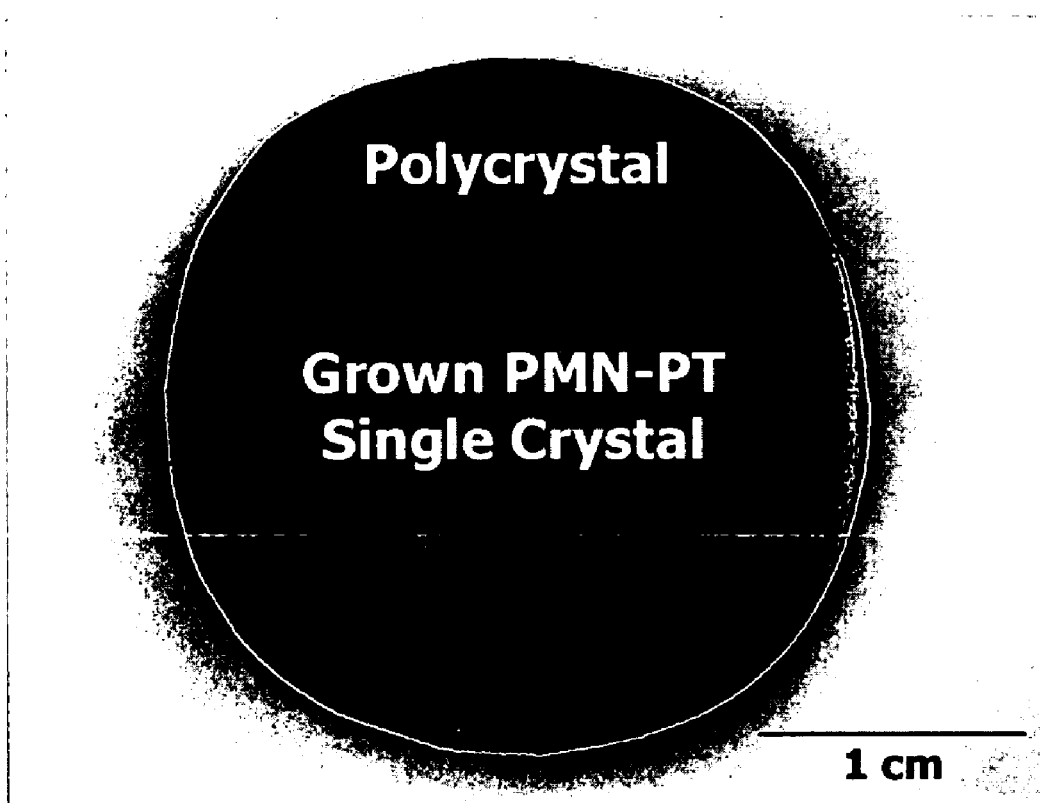
FIG. 9 is a microscopic photograph of a PMN-PT single crystal (diameter: 1.5 cm) grown from samples obtained by embedding a seed single crystal of BaTiO$_3$ in powder molded bodies further having 1% extra Mg (1Mg) in addition to the original Mg content in the composition formula of (0.92) [(0.68)Pb(Mg$_{1/3}$Nb$_{2/3}$)O$_3$-(0.32)PbTiO$_3$]-(0.08) PbO, and then heating the combination at 1200° C. for 20 hours.

FIG. 9 is a microscopic photograph of a PMN-PT single crystal (diameter: 1.5 cm) grown from samples obtained by embedding a seed single crystal of $BaTiO_3$ in powder molded bodies further having 1% extra Mg (1Mg) in addition to the original Mg content in the composition formula of (0.92) [(0.68)Pb($Mg_{1/3}Nb_{2/3}$)$O_3$-(0.32)$PbTiO_3$]-(0.08) PbO, and then heating the combination at 1200° C. for 20 hours.

This photograph shows a PMN-PT single crystal having a diameter of more than 1.5 cm in the middle of the sample surface. This demonstrates that a PMN-PT single crystal having a diameter of more than 1.5 cm can be produced by short heat treatment of only 20 hours.

Further, a PMN-PT single crystal growth from a seed single crystal could be observed, when a plate-shaped seed single crystal of barium titanate was placed on a powder sintered body of (0.92) [(0.68)Pb($Mg_{1/3}Nb_{2/3}$)$O_3$-(0.32)Pb-$TiO_3$]-(0.08)PbO, followed by being heated at 1200 for 20 hours. Therefore, a seed single crystal could rapidly grow into a polycrystal when the seed single crystal was placed on the powder molded body, as well as being embedded in the powder molded body.

The use of a seed single crystal such as "L"-shaped crystal enables a faster single crystal growth than that of a plate-shaped single crystal, because the interface between the seed single crystal and the polycrystal is increased and thus the number of the growth faces is increased.

The above Examples 1 to 4 demonstrate that primary and secondary abnormal grain growths can occur in (1−x)Pb ($Mg_{1/3}Nb_{2/3}$)$O_3$-(x)$PbTiO_3$ type when x value of the composition formula is more than a specific value, i.e., the component ratio of the polycrystal is changed, or an excess specific component such as PbO or MgO are added.

In other words, the behavior of the abnormal grain growths can be changed according to the ratio of Pb, Mg, Nb and Ti and additives.

Therefore, the method for optimizing the growth of a PMN-PN single crystal is to change the composition ratio of the respective components of PMN-PN and/or to add an excess specific component(s) of the PMN-PN and, also, to control the temperature during heat treatment such that the temperature is between the primary abnormal grain growths completion temperature and the secondary abnormal grain growths activation temperature, so as to allow the seed single crystal to grow into the polycrystal at the interface between the seed single crystal and the polycrystal, and so as to repress the secondary abnormal grain growths inside the polycrystal.

The single crystals of PMN-PT produced by these manners can be used as a seed single crystal, in order to produce various single crystals of (1−x)PMN-xPT, which have same components as one another, but have different PMN/PT from one another at low costs.

EXAMPLE 5

The regulation of powder compositions (the ratio of the components, the kind and content of an additive), sintering temperature, sintering atmosphere(air, oxygen or vacuum), pressure sintering, the amount of a liquid state, atmospheric powders and the sealing state of a crucible, which effect the densification and the abnormal grain growth of a sintered body of Pb-type perovskite oxides, enables the change of the porosity and pore shape of the sintered body. The porosity and pore shape of a polycrystal directly affect the porosity and pore shape of a grown single crystal, because the pores of the polycrystal are trapped in the single crystal during the growth of the single crystal. Therefore, if the porosity of a polycrystal is controlled, single crystals without pores, single crystals with pores, or single crystals having various pore sizes or shapes can be produced.

Following Table 1 shows the relative densities of the sintered bodies produced by adding an excess PbO and MgO to $(0.68)Pb(Mg_{1/3}Nb_{2/3})O_3$-$(0.32)PbTiO_3$ powder having MPB composition, followed by sintering the powder at 1200 for 1 hour.

TABLE 1

| MgO | PbO | | |
|---|---|---|---|
| | 0 | 2 | 8 |
| 0 | 98 | 96 | 93 |
| 1 | 97 | 97 | 94 |
| 8 | 97 | 98 | 94 |

As shown in Table 1, an excess MgO and PbO were added to the $(0.68)Pb(Mg_{1/3}Nb_{2/3})O_3$-$(0.32)PbTiO_3$ powder and then the powder was heated. As a result, it was observed that the microstructure such as the density and grain size of the sintered body changed continuously. The relative density of the sintered body without an addition of MgO or PbO was about 98%, but the relative density with an excess addition of 8 mol % PbO was reduced to 93%. According to the increase of the addition amount of PbO, the density of the sintered body was continuously reduced and the pore size was increased. But, according to the increase of the addition amount of MgO, the density of the sintered body was gradually increased and the pore size was reduced, unlike PbO. When an excess MgO was not added or the excess addition amount of MgO was not large, PMN-PT single crystal could be grown from a seed single crystal only in a composition to which many excess PbO were added. The produced single crystal had a low density of about 94%, since the density of the polycrystal was low. But, when the excess addition amount of MgO was large, PMN-PT single crystal could be grown from a seed single crystal even in a composition to which a little PbO was added. The produced single crystal had a density of more than 97%, since the density of the polycrystal was high.

The production of a polycrystal having a high relative density of more than 99% was carried out by the pressure-sintering of the powders having the composition of Table 1 at the pressure of 50 Mpa in vacuum, for densification. The composition to which the small amount of excess PbO is added can be more easily densified than the case of the large amount. But, in this case, the seed single crystal was not grown or the growth rate was less than 50/h, which is too late. However, when sufficient excess PbO and MgO were added to the polycrystal, a single crystal having a high relative density of more than 99% could be produced. Further, the production of a very dense PMN-PT single crystal could be carried out by primarily pressure-sintering a polycrystal to prepare a sintered body having a high density, and then secondly heating the adjoined combination of the compacted polycrystal and a seed single crystal of barium titanate. PMN-PT single crystals having a various porosities, e.g., a single crystal comprising pores of several % or a perfectly dense single crystal, can be produced according to this method in large quantities at low costs.

EXAMPLE 6

In this Example, the production of PZT single crystal was carried out by changing the component ratio of $Pb(Zr_xTi_{1−x})O_3$ (PZT), which is most generally used as a piezoelectric material, or by adding a specific component of PZT or an additive to the PZT, in order to induce an abnormal grain growth. The preparation of PZT powders was carried out by ball-milling PbO, $ZrO_2$ and $TiO_2$ powders in ethanol and then by calcining the powders at 800 for 4 hours. Further, $Pb(Zr_xTi_{1−x})O_3$ powders having various x values were produced by the control of the rate of $ZrO_2$ and $TiO_2$. Powder molded bodies (diameter: 10 mm, height: 3 mm) were produced by uniaxial pressure molding, and then the produced power molded bodies were subjected to CIP(Cold Isostatic Pressing) at the pressure of 200 MPa. Then, they were sintered on a platinum plate in double platinum crucibles in the range of temperature between 800° C. and 1300° C., and atmospheric powders such as lead zirconate ($PbZrO_3$[PZ]) and PbO powder were placed around the sample to repress the volatilization of PbO during sintering.

Figure 10A:
FIG. 10 is microscopic photographs of samples obtained by sintering a powder molded body having the composition formula of (0.9) [Pb(Zr$_{0.25}$Ti$_{0.75}$)O$_3$]-(0.1)PbO, at (a) 950° C. for 10 hours and (b) 1200° C. for 3 hours.
Figure 10B:
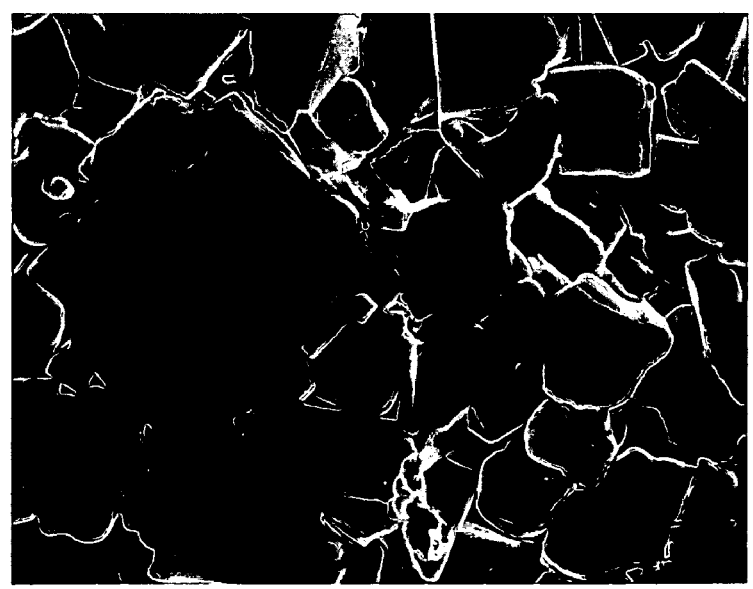

FIG. 10 is microscopic photographs of samples obtained by sintering a powder molded body having the composition formula of $(0.9)$ $[Pb(Zr_{0.25}Ti_{0.75})O_3]$-$(0.1)PbO$, at (a) 950° C. for 10 hours and (b) 1200° C. for 3 hours;

As shown in FIG. 10(a), it was observed that abnormal grain growths(primary) occurred in the samples sintered at 950° C. and that abnormal grain growths(secondary) occurred repeatedly in the samples sintered at 1200° C.

That is, in case of the heat treatment of the polycrystal of PZT with an excess amount of PbO as is like FIG. 10, it was observed according to the increasement of temperature that primary abnormal grain growths occurred at first and, next, secondary abnormal grain growths occurred after the completion of the primary abnormal grain growths.

Figure 11:
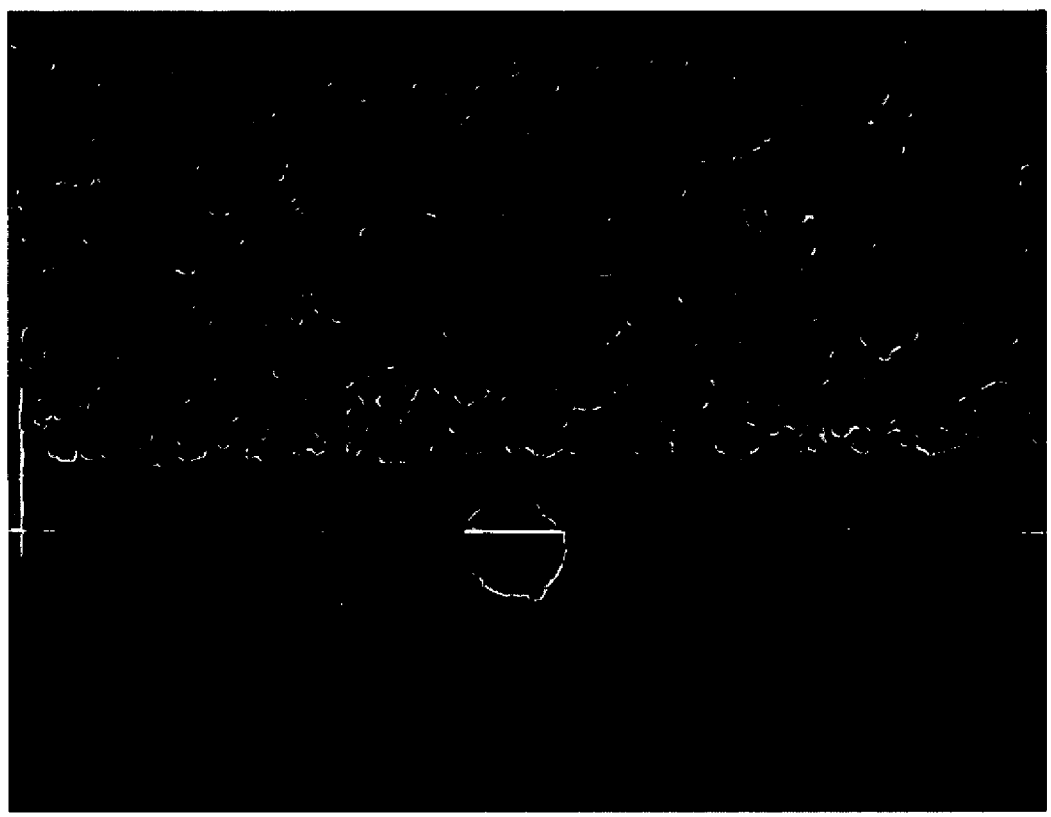
FIG. 11 is a microscopic photograph of a sample obtained by embedding a seed single crystal of BaTiO$_3$ in powder having the composition formula of (0.9) [Pb(Zr$_{0.25}$Ti$_{0.75}$)O$_3$]-(0.1)PbO, and sintering the combination at 950° C. for 100 hours.

FIG. 11 is a microscopic photograph (of same scale as FIG. 5) of a sample obtained by embedding a seed single crystal of of $BaTiO_3$ in powder having the composition formula of $(0.9)$ $[Pb(Zr_{0.25}Ti_{0.75})O_3]$-$(0.1)PbO$, and sintering the combination at 950° C. for 100 hours;

As shown in FIG. 11, in this case that the seed single crystal and polycrystal were adjoined and then heated under the condition that primary abnormal grain growths occur, the growths of the seed single crystal were not observed.

Under this condition, there were too many abnormal grains and the seed single crystal could not be grown because the encounters between the abnormal grain growths and the seed single crystals blocked the growth of the seed single crystal.

Figure 12:
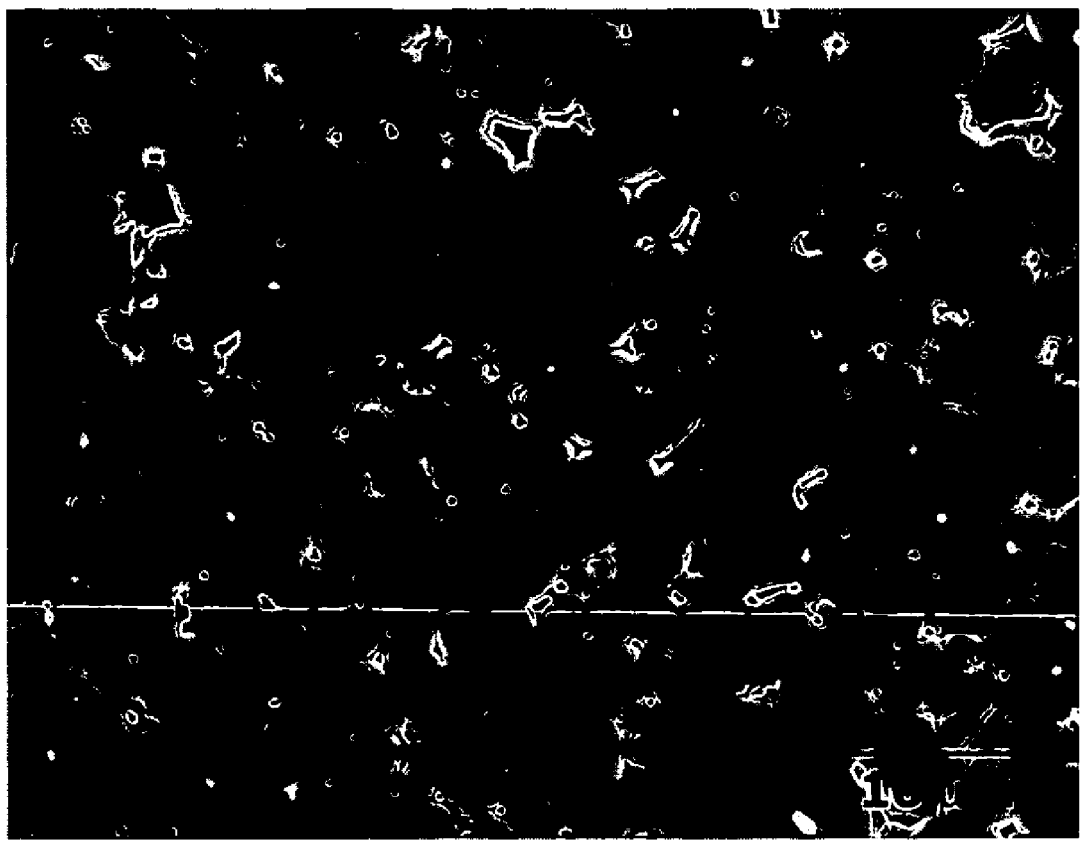
FIG. 12 is microscopic photographs of samples obtained by sintering powder molded bodies having x value of 0.6 in the composition formula of (0.9) [Pb(Zr$_x$T$_{1-x}$)O$_3$]-(0.1)PbO, at 1200° C. for 3 hours.

FIG. 12 is microscopic photographs of sample obtained by sintering powder molded bodies having x value of 0.6 in the composition formula of $(0.9)$ $[Pb(Zr_xTi_{1−x})O_3]$-$(0.1)$ PbO, at 1200° C. for 3 hours.

In case of x=0.6, the distribution of grain size shows the uniform grain growth. However, in case of x=0.25 in FIG. 10, i.e., a content of PT over a specific amount, it was observed that the abnormal grain growths occur with an excess amount of PbO.

Therefore, it came to knowledge that the abnormal grain growths occurred when an excess amont of PbO is added to the $Pb(Zr_xTi_{1-x})O_3$ having a specific x value, i.e., the ratio of $PbTiO_3$.

Figure 13:
FIG. 13 is a microscopic photograph of a sample obtained by embedding a seed single crystal of BaTiO$_3$ in a powder molded body having the composition formula of (0.9) [Pb(Zr$_{0.25}$Ti$_{0.75}$)O$_3$]-(0.1)PbO, and then sintering the combination at 1200° C. for 10 hours, wherein primary abnormal grain growths was completed.

FIG. 13 is a microscopic photograph of a sample obtained by embedding a seed single crystal of $BaTiO_3$ in a powder molded body having the composition formula of (0.9) [$Pb(Zr_{0.25}Ti_{0.75})O_3$]-(0.1)PbO, and then sintering the combination at 1200° C. for 10 hours, wherein primary abnormal grain growths were completed;

In case that x, i.e., the ratio of $PbZrO_3$ is over a specific value, abnormal grain growths and the growths of the seed single crystal did not occur. However, the seed single crystal grew in the samples(see FIG. 10), wherein secondary abnormal grain growths occurred.

Figure 14:
FIG. 14 is a microscopic photograph of a sample obtained by embedding a seed single crystal of BaTiO$_3$ in a powder molded body having the composition formula of (0.9) [Pb(Zr$_{0.6}$Ti$_{0.4}$)O$_3$]-(0.1) [(0.95)PbO-(0.05)Cr$_2$O$_3$], and then sintering the combination at 1200° C. for 10 hours.

FIG. 14 is a microscopic photograph a sample obtained by embedding a seed single crystal of $BaTiO_3$ in a powder molded body having the composition formula of (0.9) [$Pb(Zr_{0.6}Ti_{0.4})O_3$]-(0.1) [(0.95)PbO-(0.05)$Cr_2O_3$], and then sintering the combination at 1200° C. for 10 hours. When $Cr_2O_3$ as well as the PZT components, i.e., PbO, $ZrO_2$ and $TiO_2$ are added to the PZT in which x=0.6, secondary abnormal grain growths were promoted and the seed single crystal was grown.

In this Example, it was demonstrated that primary and secondary abnormal grain growths in $Pb(Zr_xTi_{1-x})O_3$ (PZT) depends on an increase of the $PbTiO_3$ content of PZT powder and an addition of additives, e.g., PbO, $B_2O_2$, CoO, $Cr_2O_3$, $Fe_2O_3$, $SiO_2$, MnO, $MoO_3$, $Nb_2O_5$, NiO, $V_2O_5$, $WO_3$ or ZnO.

If x value is too large in $Pb(Zr_xTi_{1-x})O_3$ to show abnormal grain growths, an addition of additives for induction of abnormal grain growths enables abnormal grain growths and the seed single crystal growth. If x value is so small that abnormal grain growths over-occur, an addition of additives for repression of abnormal growths enables the control of primary and secondary abnormal grain growths and the seed single crystal growth.

According to the present invention, the production of PZT single crystal was carried out by controlling the ratio of Pb, Zr and Ti in the composition formula of $Pb(Zr_xTi_{1-x})O_3$ and/or adding an additive for induction or repression of abnormal grain growths, followed by heating in a specific range of temperature (over primary abnormal grain growths completion temperature and below secondary abnormal grain growths activation temperature).

In this method, the size of PZT single crystal is in proportion to the size of the seed single crystal. For example, PZT single crystal having a size of more than several cm can be produced in large quantities at low costs by using a seed single crystal having a size of more than several cm.

EXAMPLE 7

In this Example, in order to induce an abnormal grain growth in $Pb(Zr_xTi_{1-x})O_3$, power molded bodies were produced by mixing $Pb(Zr_{0.52}Ti_{0.48})O_3$ powder having the size of 100 nm with $PbZrO_3$ powder. Powder molded bodies (diameter: 10 mm, height: 3mm) were produced by uniaxial pressure molding, and then the produced power molded bodies were subjected to CIP(Cold Isostatic Pressing) at the pressure of 200 MPa. Then, they were sintered on a platinum plate in double platinum crucibles, and lead zirconate ($PbZrO_3$[PZ]) as an atmospheric powder was placed around the sample to repress the volatilization of PbO during sintering.

Figure 15A:
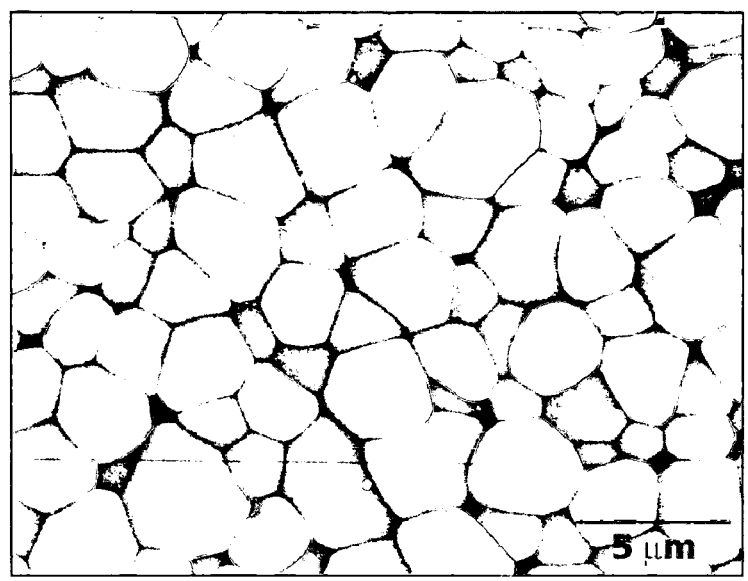
FIG. 15 is microscopic photographs of samples obtained by sintering powder molded bodies having the composition formula of (a) Pb(Zr$_{0.52}$Ti$_{0.48}$)O$_3$ and (b) (0.7)Pb(Zr$_{0.52}$Ti$_{0.48}$)O$_3$-(0.3)PbZrO$_3$, at 1200° C. for 1 hour.
Figure 15B:
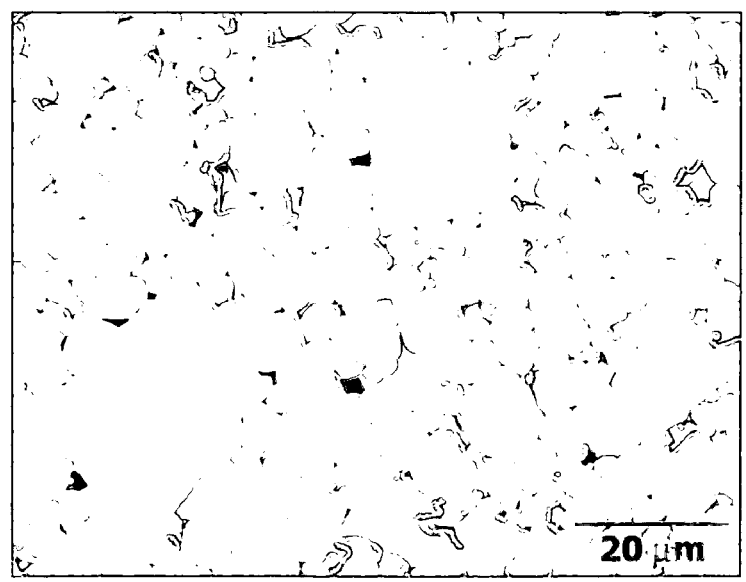

FIG. 15 is microscopic photographs of samples obtained by sintering powder molded bodies having the composition formula of (a) $Pb(Zr_{0.52}Ti_{0.48})O_3$ and (b) (0.7)$Pb(Zr_{0.52}Ti_{0.48})O_3$-(0.3)$PbZrO_3$, at 1200° C. for 1 hour. An secondary abnormal grain growth did not occur in $Pb(Zr_{0.52}Ti_{0.48})O_3$ composition, but began to occur with an addition of more than specific amount of $PbZrO_3$ and very actively occurred with an addition of more than 30mol % of $PbZrO_3$.

Figure 16:
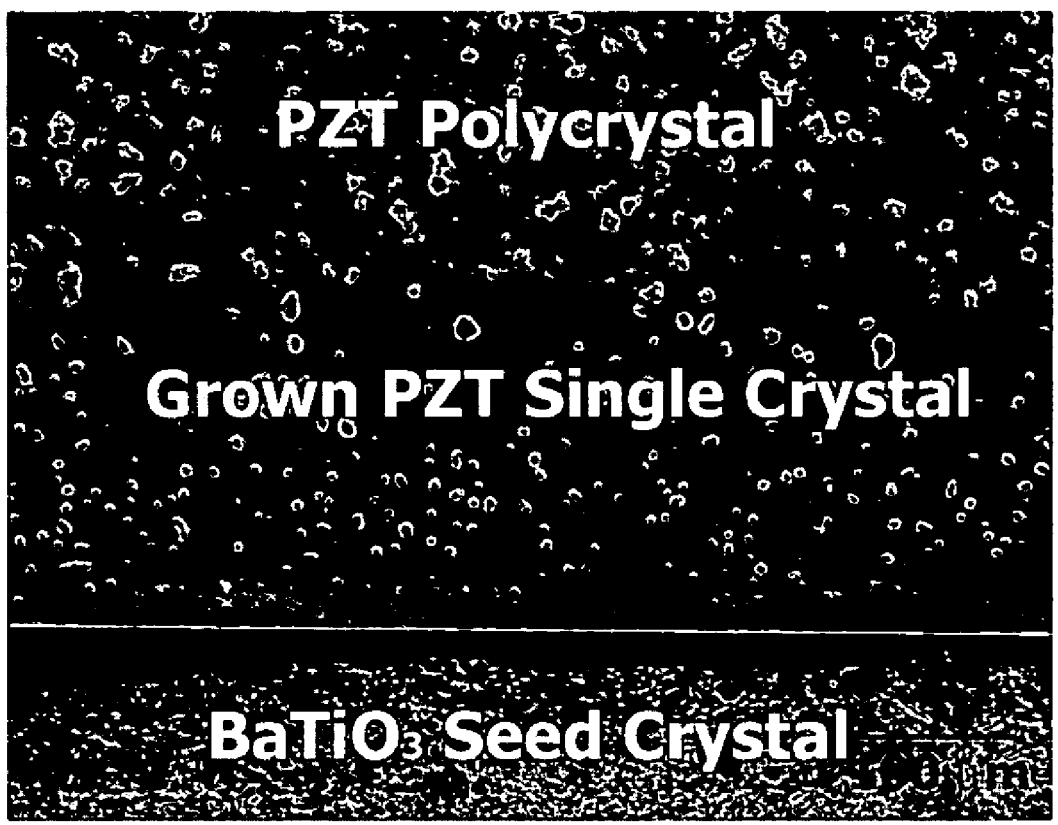
FIG. 16 is a microscopic photograph showing a PZT single crystal grown from a sample obtained by embedding a seed single crystal of BaTiO$_3$, which is a plate-shaped crystal of (111) side, in a powder molded body having the composition formula of (0.8) [Pb(Zr$_{0.52}$Ti$_{0.48}$)O$_3$]-(0.2) PbZrO$_3$, and then heating the combination at 1200° C. for 10 hours.

FIG. 16 is a microscopic photograph of a sample obtained by embedding a seed single crystal of $BaTiO_3$, which is a plate-shaped crystal of (111) side, in a powder molded body having the composition formula of (0.8) [$Pb(Zr_{0.52}Ti_{0.48})O_3$]-(0.2)$PbZrO_3$, and then heating the combination at 1200° C. for 10 hours.

In the composition to which $PbZrO_3$ is added in small amount, e.g., FIG. 13, both an secondary abnormal grain growth and a seed single crystal growth did not occur. But, in the composition to which $PbZrO_3$ is added in more than a specific amount inducing a secondary abnormal grain growth, e.g., FIG. 14, the seed single crystal was continuously grown into the PZT polycrystal and PZT single crystal was obtained.

When a grain growth was promoted in $Pb(Zr_xTi_{1-x})O_3$ (PZT) by a powder having a nano size, an abnormal grain growth occurred with an addition of $PbZrO_3$ and the seed single crystal was grown. The use of a powder having a nano size in the present method enables an abnormal grain growth and the production of PZT having a large x value.

EXAMPLE 8

In this Example, (1−x−y) [$Pb(Mg_{1/3}Nb_{2/3})O_3$]−x[$Pb(In_{1/2}Nb_{1/2})O_3$]−y[$PbTiO_3$] (0 x 1; 0 y 1; 0 x +y 1) (PMN-PIN-PT) or PMN-PIN-PT solid solution were selected among the three ingredients based materials in which three or more perovskite oxides are made in the form of solid solution, and then the single crystal of PMN-PIN-PT was prepared by changing the composition ratio or adding specific components or additives in excess amount and, also, by controlling the temperature of the heat treatment between primary abnormal grain growths completion temperature and secondary gain growths activation temperature.

Figure 17:
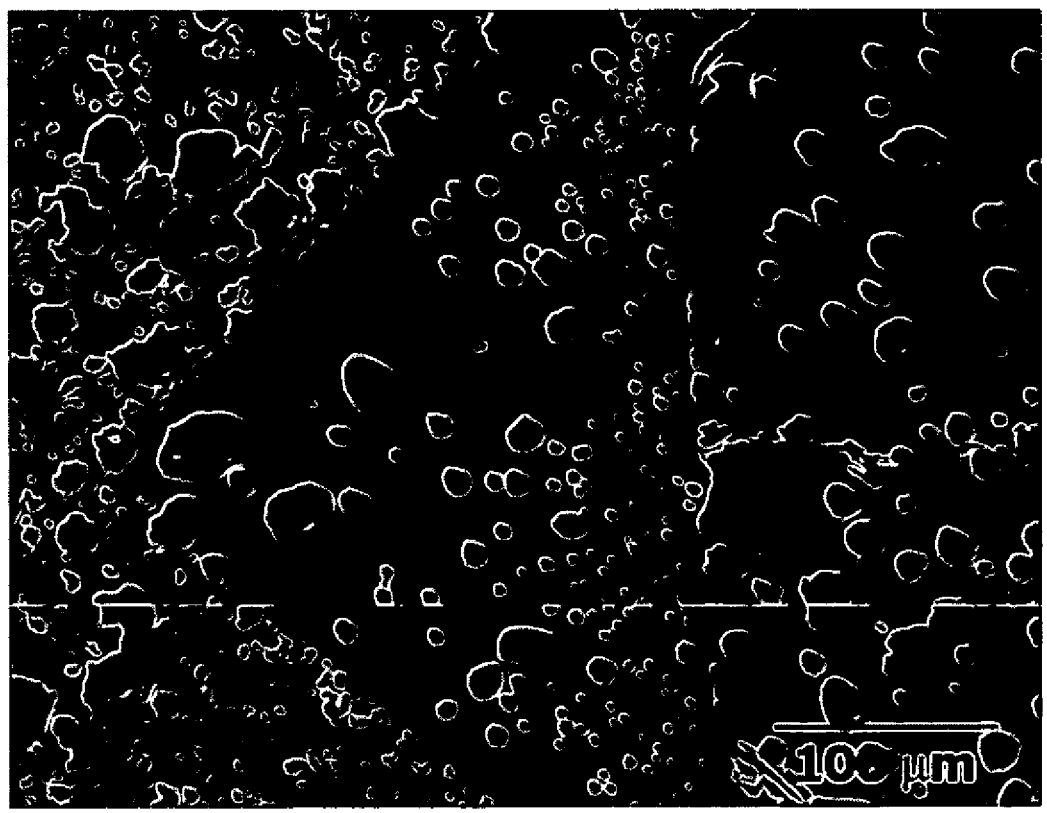
FIG. 17 is a microscopic photograph showing a cross section of a single crystal of PMN-PIN-PT grown from a sample obtained by embedding a seed single crystal of BaTiO$_3$ in powder having the composition formula of 48PMN-20PIN-32PT added with excess amount (10 mol %) of PbO, and then sintering the combination at 1200° C. for 10 hours.

FIG. 17 is a microscopic photograph showing a cross section of a single crystal of PMN-PIN-PT grown from a sample obtained by embedding a seed single crystal of $BaTiO_3$ in powder having the composition formula of 48PMN-20PIN-32PT added with excess amount (10 mol %) of PbO, and then sintering the combination at 1200° C. for 10 hours.

In case of the heat treatment at 1200° C., which is over primary abnormal grain growths completion temperature and below secondary abnormal grain growths activation temperature, the secondary abnormal grain growths did not occur. However, the seed single crystal continued to grow inside the polycrystal.

In this Example, even in case that the polycrystal has many components and a complicated composition such as the three ingredients based materials in which three or more perovskite oxides are made in the form of solid solution, it was possible to prepare the single crystal of PMN-PIN-PT having complicated composition by inducing abnormal grain growths through the adding of specific components and/or additives in excess amount and by contolling the temperature for the growths of the seed single crystal between primary abnormal grain growths completion temperature and secondary abnormal grain growths activation temperature.

EXAMPLE 9

Abnormal grain growths take place twice as primary abnormal grain growths and secondary grain growths according to the increasement of temperature over the Eutectic temperature in $BaTiO_3$ and $BaTiO_3$ solid solution. And, this phenomenon of the abnormal grain growths comes to take place differently depending on the ratio of Ba/Ti in the powder of $BaTiO_3$, type and content of solutes solved in $BaTiO_3$, type and content of additives which are not solved in $BaTiO_3$ solid solution.

The growth of grains after their generation by means of secondary abnormal grain growths is possible below secondary grain growths activation temperature. Therefore, in this Example, used is the method to make only the seed single crystal continue to grow for preparing a big single crystal by adjoining the seed single crystal and the polycrystal and then performing a heat treatment in the range of temperature between primary abnormal grain growths completion temperature and secondary abnormal grain growths activation temperature.

FIG. 18 is microscopic photographs of samples obtained by at first preparing circular plate type molded body (diameter: 15 mm, height: 7 mm) with powder of $BaTiO_3$ and pressurizing it by CIP(cold isostatic pressing) at the pressure of 20 MPa and then sintering it respectively at (a) 1300° C. for 1 hour (b) 1370° C. for 15 hours.

Figure 18A:
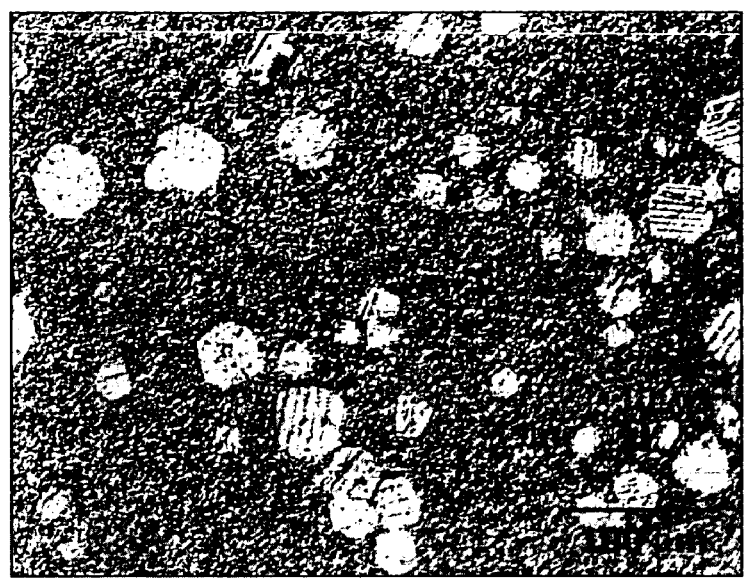
FIG. 18 is microscopic photographs of samples obtained by at first preparing circular plate type molded body (diameter: 15 mm, height: 7 mm) with powder of BaTiO$_3$ and pressurizing it by CIP (cold isostatic pressing) at the pressure of 20 MPa and then sintering it respectively at (a) 1300° C. for 1 hour (b) 1370° C. for 15 hours.
Figure 18B:
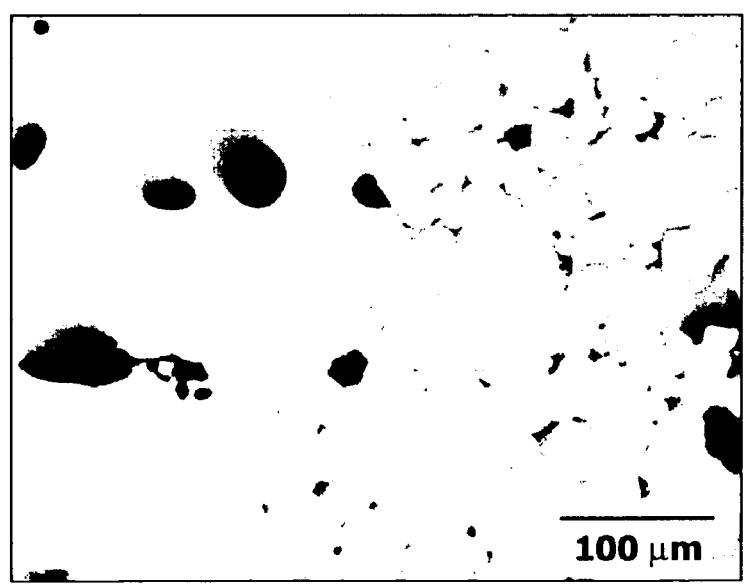

As shown in FIG. 18(a), primary abnormal grain growths were observed at 1300° C. And, as shown in FIG. 18(b), secondary abnormal grain growths were observed at 1370° C. Primary abnormal grain growths have small sizes relative to secondary abnormal grain growths, but have hundreds times as many numbers as those of the secondary abnormal grain growths. In case that $BaTiO_3$ seed single crystal was embedded in $BaTiO_3$ powder and then heat-treated at 1300° C., the temperature that primary abnormal grain growths occur, for 100 hour, the growths of the seed single crystal was not observed.

Figure 19:
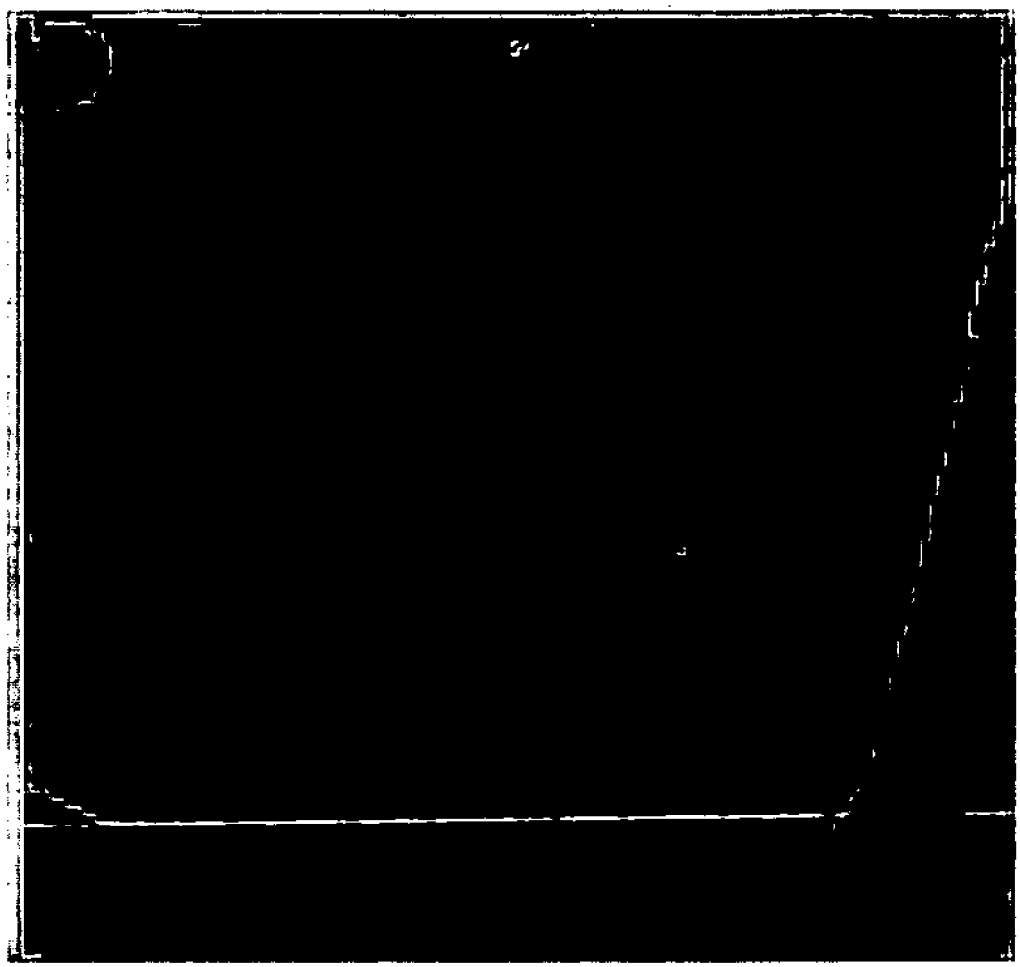
FIG. 19 is a microscopic photograph showing a single crystal grown from a sample obtained by placing a small seed single crystal (diameter: 3 mm, thickness: 1.5 mm) on the edge of a polycrystal of barium titanate, and then heating the combination for 300 hours under the condition of a temperature gradient, which is 1350° C. on the side of the seed single crystal and a decreased temperature of slightly below 1350° C. on the opposite edge side of the sample.

FIG. 19 is a microscopic photograph showing the appearance of a sample prepared with a small seed single crystal of barium titanate (diameter: 3 mm, thickness: 1.5 mm) placed on the edge of a polycrystal of barium titanate, which was prepared by pressing a powder molded body (25 g) having the size of 40×40×7 cm at 200 MPa, and subjected to 300 hours of heat treatment with a temperature gradient such that the temperature is 1350° C. on the side of the seed single crystal and decreased to a temperature slightly below 1350° C. on the opposite edge side of the sample.

The temperature gradient had the polycrystal side be in less than the secondary abnormal grain growth activation temperature, thus an abnormal grain growth did not occur in the polycrystal.

But, the seed single crystal, which initiated the growth at less than the secondary abnormal grain growth activation temperature, continued to grow into the polycrystal and thus a single crystal having a size of more than length 25 mm×width 25 mm×height 5 mm was produced.

This example demonstrates that the formation of a temperature gradient, which have the temperature of a seed single crystal high and the temperature of a polycrystal low, in the adjoined combination of the seed single crystal and the polycrystal, enables the growth of a single crystal.

EXAMPLE 10

Figure 20:
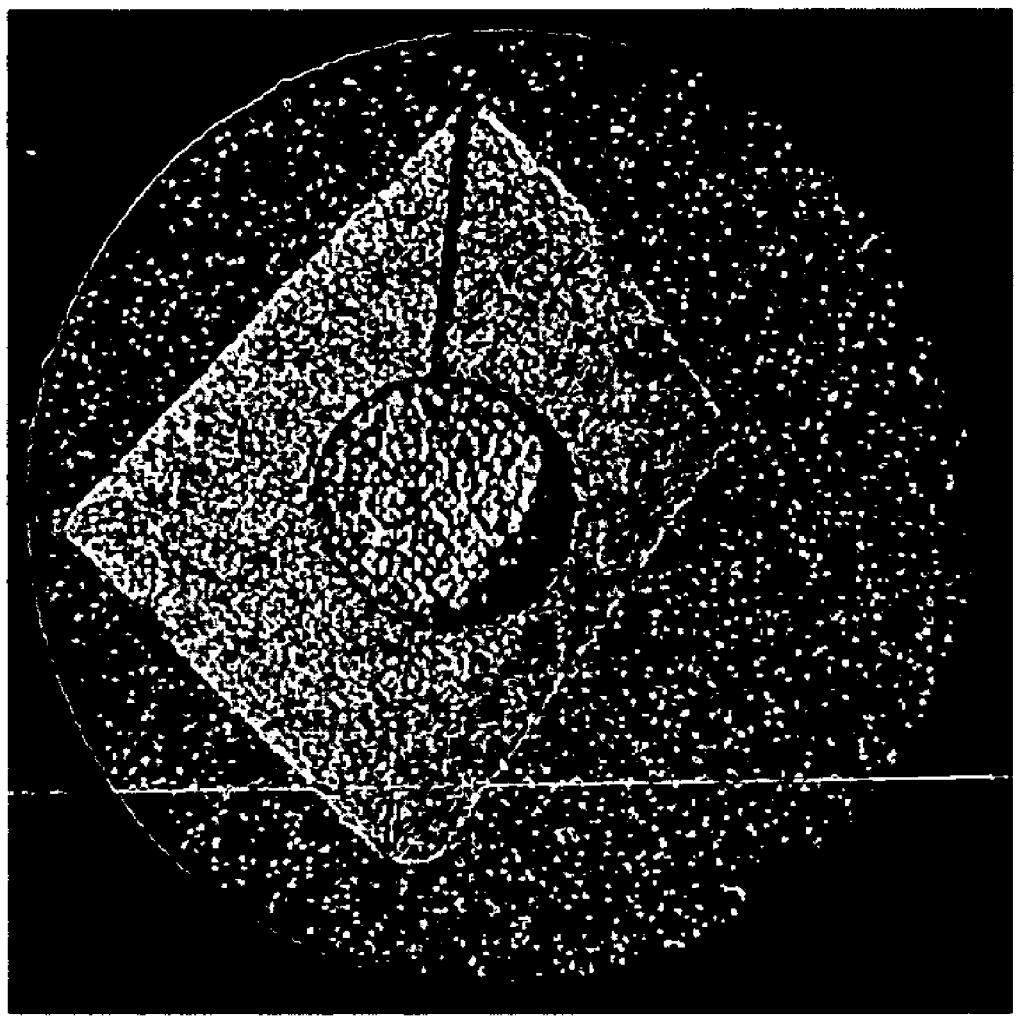
FIG. 20 is a microscopic photograph showing the appearance of a sample prepared by placing a single crystal of barium titanate including a (111) double twin plate on a polycrystal of barium titanate, and then heating the combination for 15 hours at 1350° C.

FIG. 20 is a microscopic photograph showing the appearance of a sample prepared with a single crystal of barium titanate including a (111) double twin plate placed on a polycrystal of barium titanate (diameter: 15 mm, height; 7 mm) and subjected to 15 hours of a heat treatment at 1350° C., the secondary abnormal grain growths activation temperature.

When a single crystal of barium titanate comprising a defect such as a (111) double twin plate was used as a seed single crystal, the single crystal grown from the seed single crystal also comprised a (111) double twin plate as shown in FIG. 20.

In this case, the growth rate of the single crystal with a defect was faster than that of the single crystal without a defect in the polycrystal.

Therefore, this Example demonstrated that a defect such as a (111) double twin plate promotes the growth of a single crystal into a polycrystal. In this Example, a small single crystal of barium titanate including a (111) double twin plate was adjoined to a polycrystal of barium titanate. As a result, a large single crystal of barium titanate could be produced and a larger single crystal of barium titanate could be rapidly produced using the produced large single crystal of barium titanate with a (111) double twin plate as a seed single crystal.

EXAMPLE 11

Figure 21A:
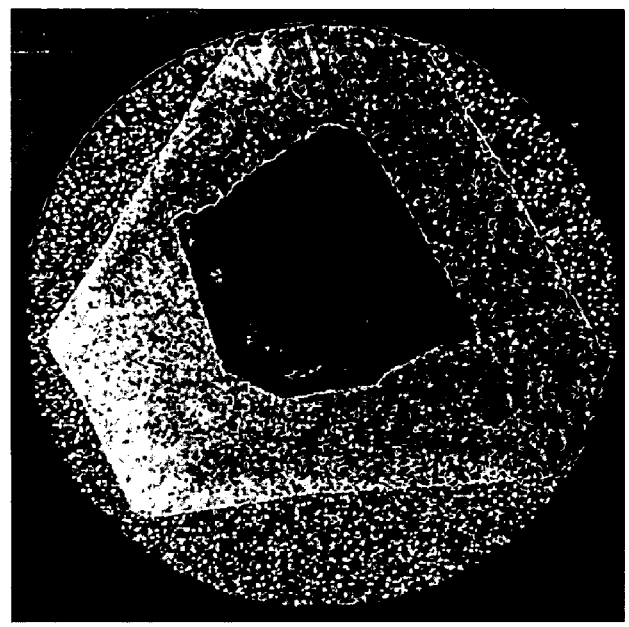
FIG. 21 is microscopic photographs showing the surface (a) and the cross section(b) of a sample prepared by placing a single crystal of barium titanate on a molded body and then heating at 1350° C. for 50 hours, wherein the molded body is formed by laminating in a row three powders(each thickness: 1.5 mm) having the composition formulas of (99.9) BaTiO$_3$-(0.1)MnO$_2$(mol %); (99.9)BaTiO$_3$-(0.1)NbO$_{2.5}$ (mol %); and (99.9)BaTiO$_3$-(0.1)CeO$_2$(mol %).
Figure 21B:
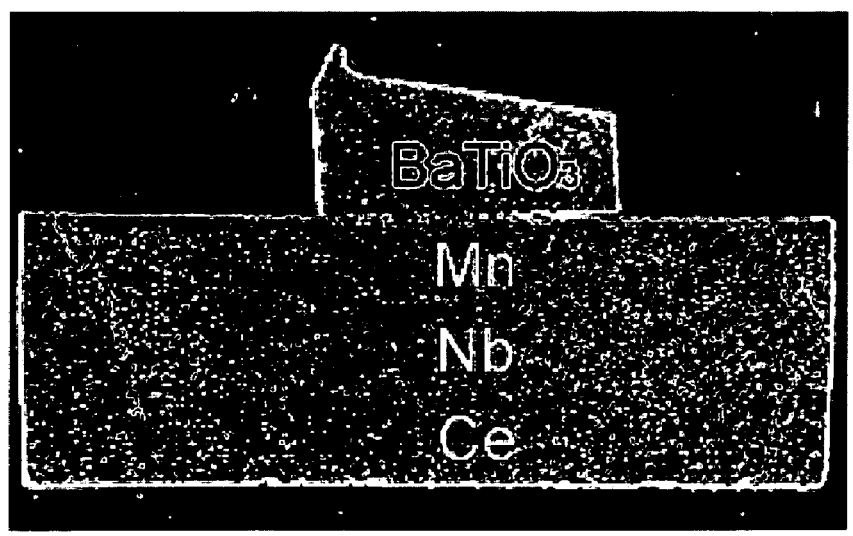

FIG. 21 is microscopic photographs showing the surface (a) and the cross section (b) of a sample prepared by placing a single crystal of barium titanate on a molded body and then heating at 1350° C., the secondary abnormal grain growths activation temperature, for 50 hours, wherein the molded body is formed by laminating in a row three powders (each thickness: 1.5 mm) having the composition formulas of (99.9)$BaTiO_3$-(0.1)$MnO_2$(mol %); (99.9)$BaTiO_3$-(0.1)$NbO_{2.5}$(mol %); and (99.9)$BaTiO_3$-(0.1)$CeO_2$(mol %) and then subjecting to CIP at 200 MPa. Firstly, the seed single crystal of barium titanate began to grow into the layer comprising $MnO_2$.

Then, it continued to grow into the layer comprising $NbO_{2.5}$ and $CeO_2$. As a result, a single crystal of barium titanate solid solution with a continual composition variation, which is composed of four layers, i.e., undoped barium titanate, Mn solid solution, Nb solid solution and Ce solid solution was produced.

As described above, the SSCG method is more advantageous than the general LSCG method in that the SSCG method enables the production of a single crystal having a composition gradient unlike the LSCG method.

As described above, the method for growing single crystals of perovskite oxides according to the present invention has some advantages to provide a manufacturing process for single crystals such as undoped single crystals of barium titanate, single crystals of barium titanate solid solution, single crystals of Pb-type perovskite and single crystals of Pb-type perovskite solid solution by using a simple heat treatment method without special equipments or skilled functions, as a result of which a large amount of single crystals large enough for practical uses of more than several cm can be produced at low costs.

The method also enables production of single crystals having various additive contents by using a sintered body of the polycrystal with various additives added thereto. This method for growing single crystals of barium titanate and barium titanate solid solution according to the present invention allows a growth of single crystals without a limitation in the size of the single crystal and provides high reproducibility of the single crystals with a composition gradient.

The method also makes it possible to control the porosity of the single crystal, and the size and shape of pores, and prepare a complicated single crystal from a polycrystal of a specific shape which is intended adjoined to the seed single crystal by heat treatment without a complicated step of processing a single crystal.

This method of the present invention is efficient in the economical aspect because the final single crystals can be reused as a seed single crystal to produce various seed single crystals at low costs, and also applicable to other systems showing abnormal grain growths as well as barium titanate, barium titanate solid solution, Pb-type perovskite and Pb-type perovskite solid solution.

What is claimed is:

1. A method for growing single crystals of perovskite oxides, comprising, adjoining a perovskite seed single crystal to a polycrystal of a perovskite oxide having an original composition, to provide an adjoined combination having an interface between the single crystal and the polycrystal, and then heating the adjoined combination; and, so as to make the seed single crystal grow into a polycrystal at the interface between the seed single crystal and the polycrystal and to repress secondary abnormal grain growths inside the polycrystal, 1) the composition ratio of the polycrystal being controlled and/or at least one specific component of the polycrystal being added in an excess amount compared to the amount of said specific component of said original composition of the polycrystal, and 2) said heat treatment being performed at a temperature which is over the primary abnormal grain growths completion temperature and below the secondary abnormal grain growths activation temperature, thereby, allowing the seed single crystal to grow continuously, and said heat treatment being carried out by adding at least one additive, which lowers the secondary abnormal grain growths activation temperature, to the interface between the single crystal and the polycrystal.

2. The method as claimed in claim 1, wherein the heat treatment is carried out by applying a higher temperature at the single crystal side of said adjoined combination and a lower temperature at the polycrystal side.

3. The method as claimed in claim 1, wherein the at least one additive is one or more selected from the group consisting of $Al_2O_3$, $B_2O_3$, $CuO$, $GeO_2$, $Li_2O_3$, $P_2O_5$, $PbO$, $SiO_2$ and $V_2O_5$.

4. The method as claimed in claim 1, wherein the polycrystal of perovskites oxides is one or more selected from the group consisting of $BaTiO_3$; $BaTiO_3$ solid solution (($Ba_{1-x},M_x$)($Ti_{1-y},N_y$)$O_3$) wherein M and N are elements of solid solute ($0 \leq x \leq 1$, $0 \leq y \leq 1$);

$(1-x)$ [Pb($Mg_{1/3}Nb_{2/3}$)$O_3$]–x[PbTiO$_3$] ($0 \leq x \leq 1$) (PMN-PT);

PMN-PT solid solution;

Pb($Zr_xTi_{1-x}$)$O_3$($0 \leq x \leq 1$) (PZT);

PZT solid solution;

$(1-x-y)$ [Pb ($Mg_{1/3}Nb_{2/3}$)$O_3$]–x[PbTiO$_3$]–y[PbZrO$_3$] ($0 \leq x \leq 1$; $0 \leq y \leq 1$; $0 \leq x+y \leq 1$) (PMN-PT-PZ);

PMN-PT-PZ solid solution;

$(1-x-y)$ [Pb ($Yb_{1/2}Nb_{1/2}$)$O_3$]–x[PbTiO$_3$]–y[PbZrO$_3$] ($0 \leq x \leq 1$; $0 \leq y \leq 1$; $0 \leq x+y \leq 1$) (PYbN-PT-PZ);

PYbN-PT-PZ solid solution;

$(1-x-y)$ [Pb($In_{1/2}Nb_{1/2}$)$O_3$]–x[PbTiO$_3$]–y[PbZrO$_3$] ($0 \leq x \leq 1$; $0 \leq y \leq 1$; $0 \leq x+y \leq 1$) (PIN-PT-PZ); PIN-PT-PZ solid solution;

$(1-x-y)$ [Pb ($Mg_{1/3}Nb_{2/3}$)$O_3$]–x[Pb ($Yb_{1/2}Nb_{1/2}$)$O_3$]–y[PbTiO$_3$] ($0 \leq x \leq 1$; $0 \leq y \leq 1$; $0 \leq x+y \leq 1$) (PMN-PYbN-PT);

PMN-PYbN-PT solid solution;

$(1-x-y)$ [Pb ($Mg_{1/3}Nb_{2/3}$)$O_3$]–x[Pb ($In_{1/2}Nb_{1/2}$)$O_3$]–y[PbTiO$_3$] ($0 \leq x \leq 1$; $0 \leq y \leq 1$; $0 \leq x+y \leq 1$) (PMN-PIN-PT) and PMN-PIN-PT solid solution.

5. The method as claimed in claim 1, wherein the seed single crystal is the perovskite single crystal produced by said method.

6. The method as claimed in claim 5, wherein the seed single crystal is a single crystal of barium titanate or perovskite having the same crystal structure as barium titanate.

7. The method as claimed in claim 1, further comprising the step of: prior to adjoining the polycrystal to the seed single crystal, molding the polycrystal powder or processing the polycrystal into a specific shape which is intended as a final shape, and then adjoining the shaped polycrystal to the seed single crystal, to produce a single crystal having said specific shape which is intended without a separate step for processing of the single crystal.

8. A method for growing single crystals of perovskite oxides comprising:

adjoining a perovskite seed single single crystal to a polycrystal of a perovskite oxide having an original composition, to provide an adjoined combination having an interface between the single crystal and the polycrystal, and then heating the adjoined combination and, so as to make the seed single crystal grow into a polycrystal at the interface between the seed single crystal and the polycrystal and to repress secondary abnormal grain growths inside the polycrystal, 1) the composition ratio of the polycrystaal being controlled and/or at least one specific component of the polycrystal being added in an excess amount compared to the amount of said specific component of said original composition of the polycrystal, and 2) said heat treatment being performed at a temperature which is over the primary abnormal grain growths completion temperature and below the secondary abnormal grain growths activation temperature, thereby, allowing the seed single crystal to grow continuously, and prior to adjoining the seed single crystal to the polycrystal, preparing a polycrystal having a unique porosity, pore size and pore shape by adding an additive to the polycrystal, changing the amount of a liquid phase or the sintering temperature, atmosphere or pressure of the polycrystal, to control the porosity, the pore size and shape in the single crystal to be grown in the polycrystal, thereby preparing perfectly dense single crystals destitute of pores or single crystals having various porosities.

9. A method for growing single crystals of perovskite oxides comprising:

adjoining a perovskite seed single single crystal to a polycrystal of a perovskite oxide having an original composition, to provide an adjoined combination having an interface between the single crystal and the polycrystal, and then heating the adjoined combination and, so as to make the seed single crystal grow into a polycrystal at the interface between the seed single crystal and the polycrystal and to repress secondary abnormal grain growths inside the polycrystal, 1) the composition ratio of the polycrystaal being controlled and/or at least one specific component of the polycrystal being added in an excess amount compared to the amount of said specific component of said original composition of the polycrystal, and 2) said heat treatment being performed at a temperature which is over the primary abnormal grain growths completion temperature and below the secondary abnormal grain growths activation temperature, thereby, allowing the seed single crystal to grow continuously, and the polycrystal of perovskite oxides being the polycrystal having a composition gradient that changes discontinuously or continuously by adding one or more solutes to be solved into perovskite structures to the perovskite polycrystal.

10. The method as claimed in claim 1, wherein the polycrystal is adjoined to the single seed crystal of perovskites having a crystal defects of (111) double twin, (111) single twin, dislocations.

11. The method as claimed in claim 1, wherein the polycrystal of perovskite oxides is heat-treated under an atmosphere which represses abnormal grain growths, before and/or during the heat treatment for the growths of the seed single crystal.

12. The method as claimed in claim 11, wherein the atmosphere is a reducing atmosphere.

13. A method for growing single crystals of perovskite oxides comprising:

adjoining a perovskite seed single single crystal to a polycrystal of a perovskite oxide having an original composition, to provide an adjoined combination having an interface between the single crystal and the polycrystal, and then heating the adjoined combination and, so as to make the seed single crystal grow into a polycrystal at the interface between the seed single crystal and the polycrystal and to repress secondary abnormal grain growths inside the polycrystal, 1) the composition ratio of the polycrystaal being controlled and/or at least one specific component of the polycrystal being added in an excess amount compared to the amount of said specific component of said original composition of the polycrystal, and 2) said heat treatment being performed at a temperature which is over the primary abnormal grain growths completion temperature and below the secondary abnormal grain growths activation temperature, thereby, allowing the seed single crystal to grow continuously, and the polycrystal of perovskite oxides being (1−x) [Pb(Mg$_{1/3}$ Nb$_{2/3}$)O$_3$]−x[PbTiO$_3$] (0≦x≦1) (PMN-PT) polycrystal, and the polycrystal being prepared by adding PbO and MgO, which are components of the polycrystal, in an excess amount compared to the original composition of the polycrystal.

14. A method for growing single crystals of perovskite oxides comprising:

adjoining a perovskite seed single single crystal to a polycrystal of a perovskite oxide having an original composition, to provide an adjoined combination having an interface between the single crystal and the polycrystal, and then heating the adjoined combination and, so as to make the seed single crystal grow into a polycrystal at the interface between the seed single crystal and the polycrystal and to repress secondary abnormal grain growths inside the polycrystal, 1) the composition ratio of the polycrystaal being controlled and/or at least one specific component of the polycrystal being added in an excess amount compared to the amount of said specific component of said original composition of the polycrystal, and 2) said heat treatment being performed at a temperature which is over the primary abnormal grain growths completion temperature and below the secondary abnormal grain growths activation temperature, thereby, allowing the seed single crystal to grow continuously, and the polycrystal of perovskite oxides being Pb(Zr$_x$Ti$_{1-x}$)O$_3$ (0≦x≦1) (PZT) polycrystal, and the polycrystal being prepared by adding PbO, which is a component of the polycrystal, in excess amount compared to the original composition of the polycrystal.

15. The method as claimed in claim 14, the heat treatment is carried out by using Pb(Zr$_x$Ti$_{1-x}$)O$_3$ powder particles having nano sizes.

* * * * *